US011189599B2

(12) United States Patent
Yu et al.

(10) Patent No.: US 11,189,599 B2
(45) Date of Patent: Nov. 30, 2021

(54) SYSTEM FORMED THROUGH PACKAGE-IN-PACKAGE FORMATION

(71) Applicant: Taiwan Semiconductor Manufacturing Company, Ltd., Hsinchu (TW)

(72) Inventors: Chen-Hua Yu, Hsinchu (TW); Sung-Feng Yeh, Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/589,653

(22) Filed: Oct. 1, 2019

(65) Prior Publication Data
US 2020/0381397 A1 Dec. 3, 2020

Related U.S. Application Data

(60) Provisional application No. 62/854,401, filed on May 30, 2019.

(51) Int. Cl.
*H01L 25/065* (2006.01)
*H01L 23/00* (2006.01)
*H01L 23/31* (2006.01)
*H01L 23/485* (2006.01)
*H01L 21/56* (2006.01)
(Continued)

(52) U.S. Cl.
CPC ........ *H01L 25/0657* (2013.01); *H01L 21/561* (2013.01); *H01L 21/76898* (2013.01); *H01L 21/78* (2013.01); *H01L 23/3135* (2013.01); *H01L 23/485* (2013.01); *H01L 24/08* (2013.01); *H01L 24/89* (2013.01); *H01L 25/50* (2013.01); *H01L 2224/08145* (2013.01); *H01L 2224/80895* (2013.01); *H01L 2224/80896* (2013.01);
(Continued)

(58) Field of Classification Search
CPC . H01L 21/561; H01L 21/76898; H01L 21/78; H01L 2224/08145; H01L 2224/80895; H01L 2224/80896; H01L 2225/06548; H01L 2225/06568; H01L 23/3135; H01L 23/485; H01L 24/08; H01L 24/89; H01L 25/0657; H01L 25/50
See application file for complete search history.

(56) References Cited

U.S. PATENT DOCUMENTS 9,337,120 B2 * 5/2016 Li ............................ H01L 23/36
10,347,606 B2 7/2019 Yu et al.
(Continued)

FOREIGN PATENT DOCUMENTS

TW 201725659 A 7/2017
TW 201917847 A 5/2019

*Primary Examiner* — Mohammed Shamsuzzaman
(74) *Attorney, Agent, or Firm* — Slater Matsil, LLP

(57) ABSTRACT

A package includes a first device die, and a second device die bonded to the first device die through hybrid bonding. The second device die is larger than the first device die. A first isolation region encapsulates the first device die therein. The first device die, the second device die, and the first isolation region form parts of a first package. A third device die is bonded to the first package through hybrid bonding. The third device die is larger than the first package. A second isolation region encapsulates the first package therein. The first package, the third device die, and the second isolation region form parts of a second package.

20 Claims, 32 Drawing Sheets

(51) Int. Cl.
*H01L 25/00* (2006.01)
*H01L 21/78* (2006.01)
*H01L 21/768* (2006.01)

(52) U.S. Cl.
CPC ............... *H01L 2225/06548* (2013.01); *H01L 2225/06568* (2013.01)

(56) References Cited

U.S. PATENT DOCUMENTS

| | | | |
|---|---|---|---|
| 10,522,449 B2 * | 12/2019 | Chen | H05K 7/1053 |
| 10,847,468 B2 * | 11/2020 | Kim | H01L 23/5384 |
| 2014/0175637 A1 * | 6/2014 | Stuber | H01L 25/50 257/737 |
| 2015/0318246 A1 * | 11/2015 | Yu | H01L 25/065 257/774 |
| 2016/0056102 A1 * | 2/2016 | Konchady | H01L 23/5383 174/263 |
| 2017/0092626 A1 * | 3/2017 | Yuan | H01L 21/768 |
| 2017/0141079 A1 * | 5/2017 | Kao | H01L 24/92 |
| 2017/0186715 A1 * | 6/2017 | Yu | H01L 24/03 |
| 2017/0365587 A1 * | 12/2017 | Hung | H01L 21/565 |
| 2018/0006006 A1 * | 1/2018 | Kim | H01L 24/94 |
| 2019/0131273 A1 | 5/2019 | Chen et al. | |

* cited by examiner

SYSTEM FORMED THROUGH PACKAGE-IN-PACKAGE FORMATION

PRIORITY CLAIM AND CROSS-REFERENCE

This application claims the benefit of the following U.S. Provisional Application No. 62/854,401, filed May 30, 2019, and entitled "System formed Through Package in Package Formation," which application is hereby incorporated herein by reference.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
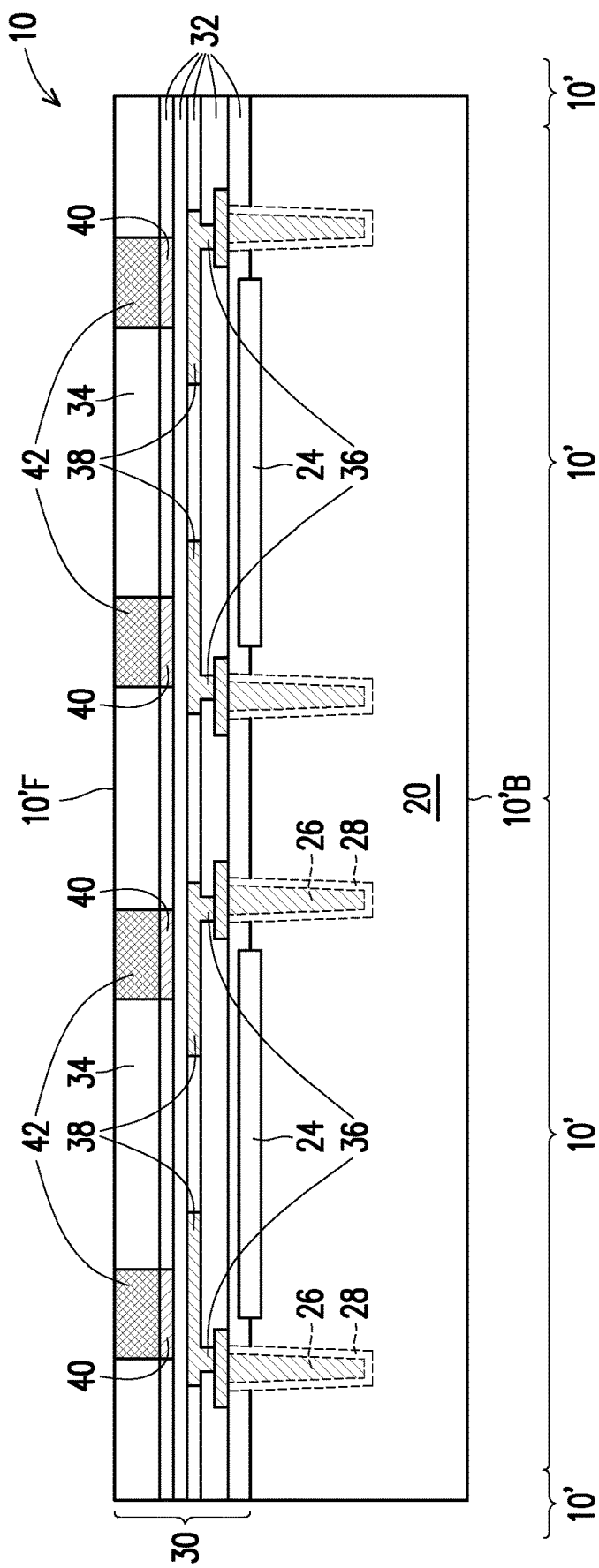
FIGS. 1 and 2 illustrate the cross-sectional views of a device wafer and a corresponding device die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a package includes a plurality of device dies bonded together. The formation of the package may include bonding device dies to a wafer to form a first reconstructed wafer. The first reconstructed wafer is singulated as first packages. The first packages are bonded to a second wafer to form a second reconstructed wafer. The second reconstructed wafer is singulated as second packages. Further processes may be performed to further incorporating more device dies with the formed packages.

FIG. 1 illustrates a device wafer in accordance with some embodiments. The subsequently used wafers (such as wafers 210 (FIG. 3), 310 (FIG. 9), 410 (FIG. 14), and 510 (FIG. 19)) may have similar or same structures as device wafer 10, hence the details of the subsequently used wafers are not discussed in detail, and the details of these wafers may be found referring to the discussion of wafer 10. Wafer 10 includes a plurality of device dies 10' therein. Device wafer 10 includes substrate 20. In accordance with some embodiments, substrate 20 is a semiconductor substrate, which may include or be a crystalline silicon substrate, while it may also comprise or be formed of other semiconductor materials such as silicon germanium, silicon carbon, or the like. In accordance with some embodiments, device dies 10' include active circuits 24, which include active devices such as transistors (not shown) formed at the top surface of semiconductor substrate 20. Through-vias (sometimes referred to as Through-Substrate Vias (TSVs)) 26 may be formed to extend into substrate 20 in accordance with some embodiments. In accordance with alternative embodiments, wafer 10 does not include TSV formed therein. TSVs 26 are also sometimes referred as through-silicon vias when formed in a silicon substrate. Each of TSVs 26 may be encircled by an isolation liner 28, which is formed of a dielectric material such as silicon oxide, silicon nitride, or the like. Isolation liners 28 isolate the respective TSVs 26 from semiconductor substrate 20. TSVs 26 and isolation liners 28 extend from a top surface of semiconductor substrate 20 to an intermediate level between the top surface and the bottom surface of semiconductor substrate 20. In accordance with some embodiments, the top surfaces of TSVs 26 are level with the top surface of semiconductor substrate 20. In accordance with alternative embodiments, TSVs 26 extend into one of dielectric layers 32, and extend from a top surface of the corresponding dielectric layer 32 down into semiconductor substrate 20.

Interconnect structure 30 is formed over semiconductor substrate 20. Interconnect structure 30 may include a plurality of dielectrics layers 32. Metal lines 38 and vias 36 are formed in dielectric layers 32, and are electrically connected to TSVs 26 and circuits 24. In accordance with some embodiments, dielectric layers 32 are formed of silicon oxide, silicon nitride, silicon carbide, silicon oxynitride, combinations thereof, and/or multi-layers thereof. Dielectric layers 32 may comprise one or more Inter-Metal-Dielectric (IMD) layers formed of low-k dielectric materials having low k values, which may be, for example, lower than about 3.0, or in the range between about 2.5 and about 3.0.

Electrical connectors 42 are formed at the top surface of device dies 10'. In accordance with some embodiments, electrical connectors 42 comprise metal pillars, metal pads, metal bumps (sometimes referred to as micro-bumps), or the like. The material of electrical connectors 42 may include non-solder materials, which may include and may be copper, nickel, aluminum, gold, multi-layers thereof, alloys thereof, or the like. Electrical connectors 42 may be electrically connected to integrated circuits 24 through some other conductive features (not shown) including, and not limited, aluminum pads, Post Passivation Interconnect (PPI), or the like, and through metal lines 38 and vias 36. Also, between electrical connectors 42 and metal lines 38, there may be dielectric layers such as low-k dielectric layers, passivation (non-low-k) layers, polymer layers, or the like.

Electrical connectors 42 are in surface dielectric layer 34, and are over and electrically connected to metal pads 40 (such as aluminum copper pads). In accordance with some embodiments of the present disclosure, there may be some Post Passivation Interconnect (PPI) between and interconnecting electrical connectors 42 and the corresponding metal pads 40. Passivation layers (formed of oxide, nitride, or the like) may be formed to cover some edge portions of metal pads 40. In accordance with some embodiments, polymer layer(s) (such as polybenzoxazole (PBO), polyimide, or the like) may be formed over the metal pads 40. In accordance with alternative embodiments, no polymer-containing dielectric layer is formed in wafer 10. In accordance with some embodiments of the present disclosure, surface dielectric layer 34 is formed of or comprise a silicon-containing dielectric material, which may or may not include oxygen. For example, surface dielectric layer 34 may comprise silicon oxide, silicon nitride, silicon oxynitride, or the like.

Throughout the description, the side of semiconductor substrate 20 having active circuits 24 and interconnect structure 30 is referred to as a front side (or active side) of semiconductor substrate 20, and the opposite side is referred to as a backside (or inactive side) of semiconductor substrate 20. Also, the front side of semiconductor substrate 20 is referred to as the front side (or active side) 10'F of wafer 10 (device die 10'), and the backside of semiconductor substrate 20 is also referred to as the backside (or inactive side) 10'B of device die 10' (wafer 10).

Figure 2:
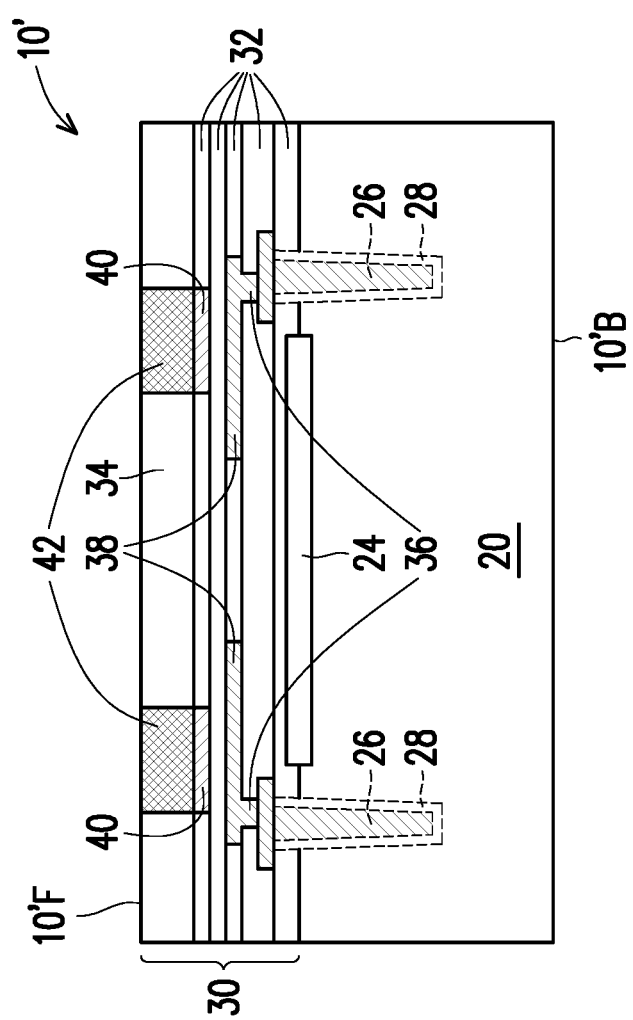

FIG. 2 illustrates a device die 10' formed by performing a singulation process to saw wafer 10 into discrete device dies 10'. In accordance with some embodiments, the device dies (such as device die 110' (FIG. 3) used in the subsequent processes may have similar structures as device die 10', and hence the details are not discussed herein.

Figure 34:
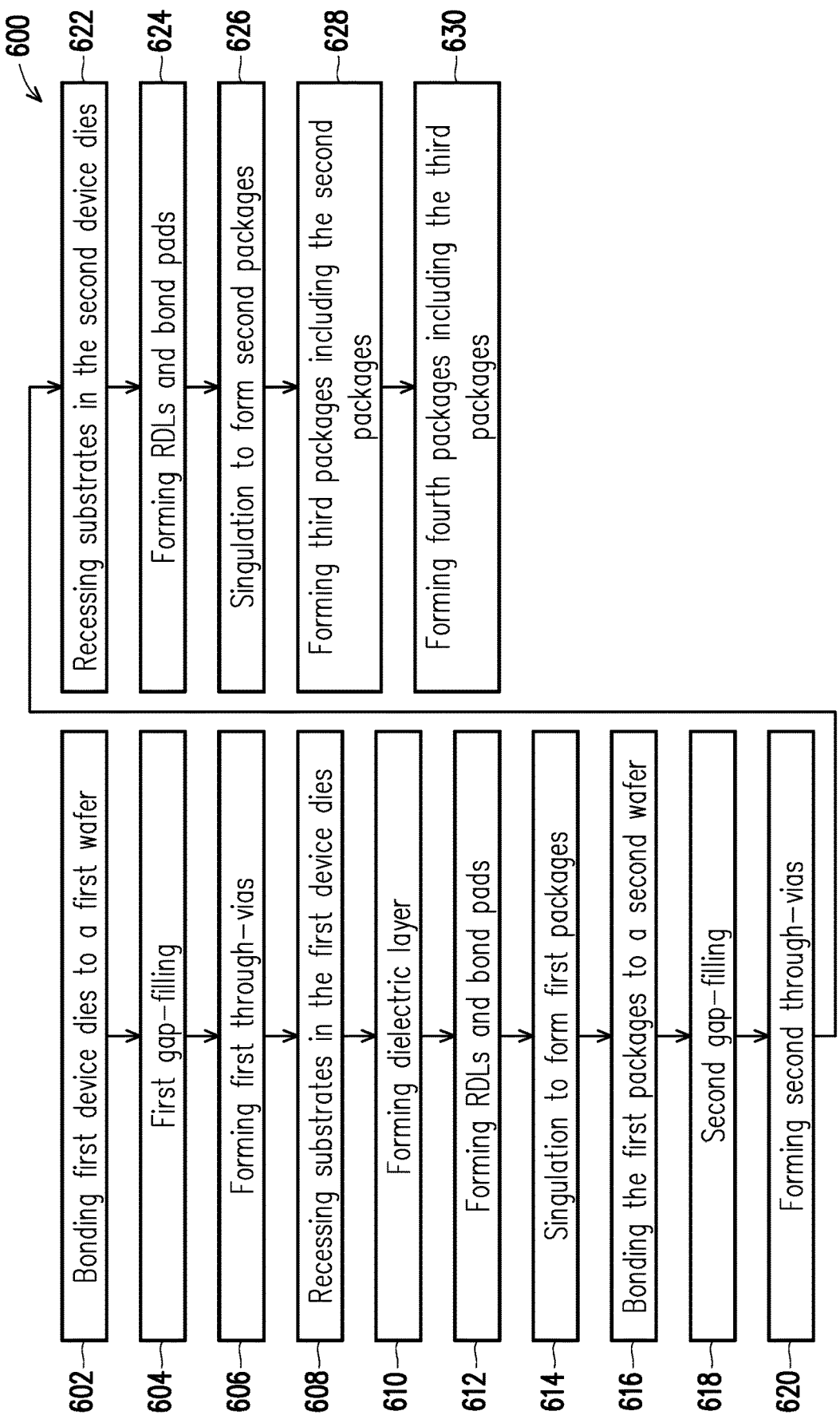
FIG. 34 illustrates a process flow for forming a package in accordance with some embodiments.

FIGS. 3 through 22 illustrate the cross-sectional views of intermediate stages in the formation of a package in accordance with some embodiments of the present disclosure. The corresponding processes are also reflected schematically in the process flow shown in FIG. 34. In subsequent processes, wafers and device dies may have similar structures as wafer 10 and device die 10' as shown in FIGS. 1 and 2, respectively. The components in the illustrated wafers and devices may be denoted with like-numbers in FIGS. 1 and 2, plus number 100, 200, 300, 400, or 500. For example, the through-vias in device die 110' may be referred to as 126, the through-vias in wafer 210 (FIG. 3) may be referred to as 226, and so on. Similarly, the electrical connectors in device die 110' may be referred to as 142, and the electrical connectors in wafer 210 may be referred to as 242, and so on. Also, the substrate in device die 110' may be referred to as 120, and the substrate in wafer 210 may be referred to as 220, and so on. The properties and the materials of the components may thus be found in the discussion referring to FIGS. 1 and 2 by referring to the features having the corresponding numbers.

Figure 3:
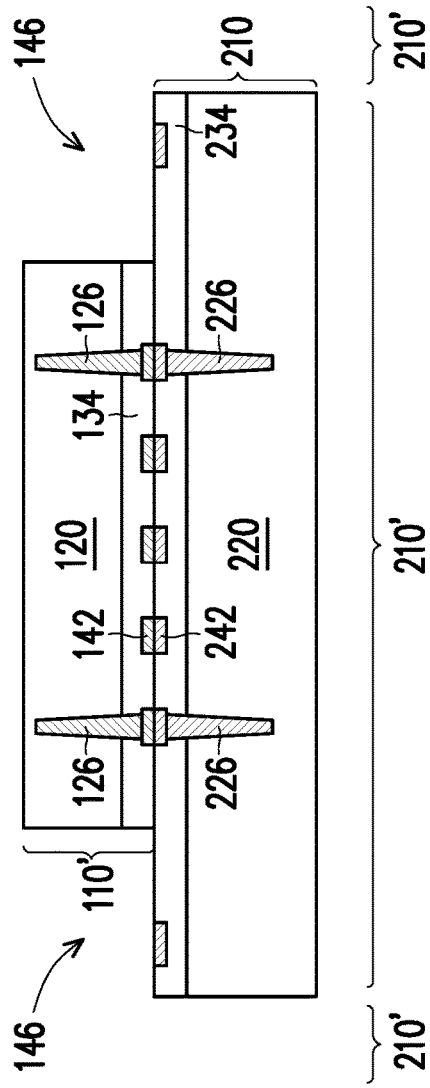
FIGS. 3 through 22 are cross-sectional views of intermediate stages in the formation of a package in accordance with some embodiments.

FIGS. 3 through 8 illustrate the intermediate stages in the bonding of device dies 110' to wafer 210 and the formation of additional features to form packages. Referring to FIG. 3, device dies 110' are bonded to wafer 210. The respective process is illustrated as process 602 in the process flow 600 in FIG. 34. Although one device die 110' is illustrated, a plurality of device dies 110' are bonded to the device dies 210' in wafer 210. The bonding of device dies 110' to wafer 210 may be achieved through hybrid bonding. Furthermore, there may be a single or a plurality of device dies 110' bonded to the same device die 210'. The plurality of device dies 110' bonded to the same device die 210' may be identical to each other, and the respective bonding structure is referred to as having a homogenous structure. Alternatively, the plurality of device dies 110' bonded to the same device die 210' may have structures different from each other, and the respective bonding structure is referred to as having a heterogeneous structure.

In the hybrid bonding, bond pads 142 are bonded to bond pads 242 through metal-to-metal direct bonding. In accordance with some embodiments of the present disclosure, the metal-to-metal direct bonding is or comprises copper-to-copper direct bonding. Furthermore, surface dielectric layer 134 is bonded to surface dielectric layer 234 through dielectric-to-dielectric bonding, which may be fusion bonding. For example, Si—O—Si bonds may be generated, with Si—O bonds being in a first one of dielectric layers 134 and 234, and Si atoms being in a second one of dielectric layers 134 and 234.

To achieve the hybrid bonding, device dies 110' are first pre-bonded to dielectric layer 234 and bond pads 242 by lightly pressing device dies 110' against wafer 210. After all device dies 110' are pre-bonded, an anneal is performed to cause the inter-diffusion of the metals in bond pads 242 and the corresponding overlying bond pads 142. The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments. Through the hybrid bonding, bond pads 142 are bonded to the corresponding bond pads 242 through direct metal bonding caused by metal inter-diffusion.

In accordance with some embodiments, after the bonding process, a backside grinding is performed to thin device dies 110', for example, to a thickness between about 15 µm and about 30 µm. Through the thinning of device dies 110', the aspect ratio of gaps 146 is reduced in order to reduce the difficulty in the gap filling process. After the backside grinding, TSVs 126 may be revealed. Alternatively, TSVs 126 are not revealed at this time, and the backside grinding is stopped when there is still a thin layer of substrate 120 covering TSVs 126. In accordance with these embodiments, TSVs 126 may be revealed in the step shown in FIG. 5. In accordance with other embodiments in which the aspect ratio of gaps 146 is not too high, the backside grinding is skipped.

Figure 4:
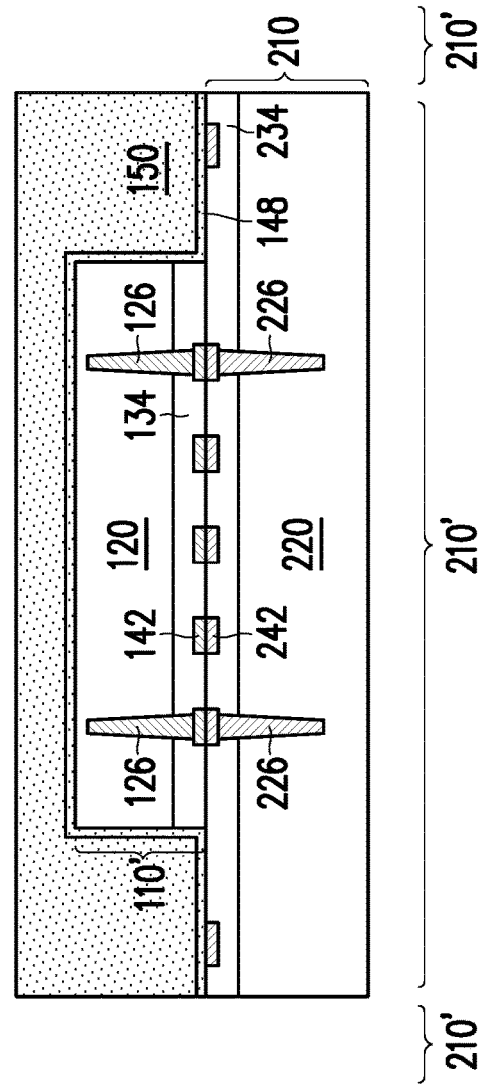

FIG. 4 illustrates the formation of gap-filling materials/layers, which include dielectric layer 150 and the underlying dielectric liner (etch stop layer) 148. The respective process is illustrated as process 604 in the process flow 600 in FIG. 34. Etch stop layer 148 is formed of a dielectric material that has a good adhesion to the sidewalls of device dies 110' and the top surfaces of dielectric layer 234 and bond pads 242. In accordance with some embodiments of the present disclosure, etch stop layer 148 is formed of a nitride-containing material such as silicon nitride. Etch stop layer 148 may be a conformal layer. The deposition may include a conformal deposition method such as Atomic Layer Deposition (ALD) or Chemical Vapor Deposition (CVD).

Dielectric layer 150 is formed of a material different from the material of etch stop layer 148. In accordance with some embodiments of the present disclosure, dielectric layer 150 is formed of silicon oxide, while other dielectric materials such as silicon carbide, silicon oxynitride, silicon oxy-carbonitride, PSG, BSG, BPSG, or the like may also be used. Dielectric layer 150 may be formed using CVD, High-Density Plasma Chemical Vapor Deposition (HDPCVD), Flowable CVD, spin-on coating, or the like. Dielectric layer 150 fully fills the remaining gaps 146 (FIG. 3).

In accordance with alternative embodiments of the present disclosure, instead of forming dielectric layers 148 and 150, device die 110' is encapsulated by an encapsulant, which may be formed of molding compound, molding underfill, a resin, an epoxy, a polymer, and/or the like.

Figure 5:
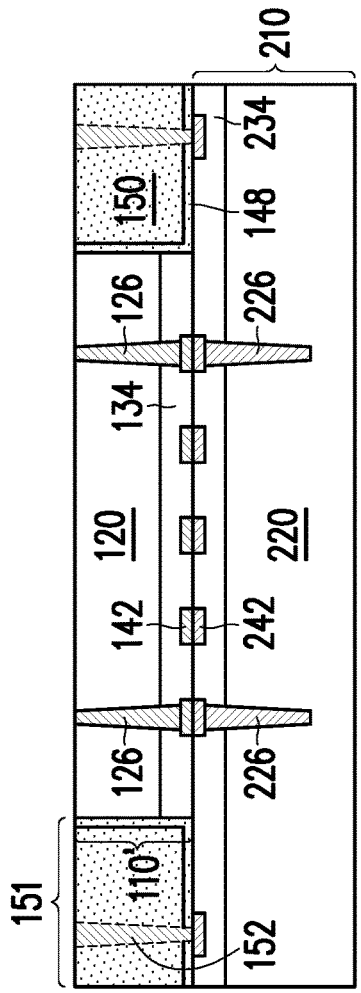

Referring to FIG. 5, a planarization process such as a CMP process or a mechanical grinding process is performed to remove excess portions of gap-filling layers 148 and 150, so that device dies 110' are exposed. The planarization process may be continued until TSVs 126 are exposed. The remaining portions of layers 148 and 150 are collectively referred to as (gap-filling) isolation regions 151.

Next, openings (occupied by through-dielectric vias 152) are formed by etching dielectric layer 150 and etch stop layer 148. Through-dielectric vias 152 (also referred to as through-vias) are then formed to fill the openings, and connect to bond pads 242. The respective process is illustrated as process 606 in the process flow 600 in FIG. 34. In accordance with some embodiments of the present disclosure, the formation of through-vias 152 includes performing a plating process such as an electro-chemical plating process or an electro-less plating process. Through-vias 152 may include a metallic material such as tungsten, aluminum, copper, or the like, or alloys thereof. A conductive barrier layer (such as titanium, titanium nitride, tantalum, tantalum nitride, or the like) may also be formed underlying the metallic material. A planarization process such as a CMP process is performed to remove excess portions of the plated metallic material, and the remaining portions of the metallic material form through-vias 152. Through-vias 152 may have substantially straight and vertical sidewalls. Alternatively, through-vias 152 may have a tapered profile, with top widths slightly greater than the respective bottom widths. In accordance with alternative embodiments, through-vias 152 are not formed. Accordingly, through-vias 152 are illustrated using dashed lines to indicate that they may be or may not be formed.

Figure 6:
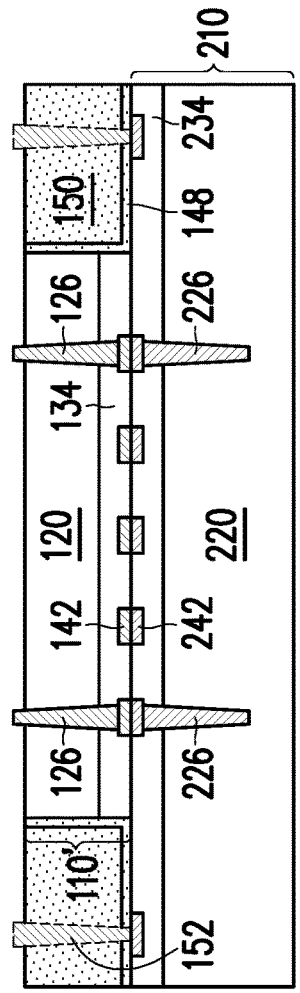

In accordance with some embodiments of the present disclosure, as shown in FIG. 6, semiconductor substrate 120 is slightly recessed, for example through an etching process, so that the top portions of TSVs 226 protrude out of the recessed semiconductor substrate 120. The respective process is illustrated as process 608 in the process flow 600 in FIG. 34. Isolation regions 151 may be, or may not be, recessed when semiconductor substrate 120 is recessed.

Figure 7:
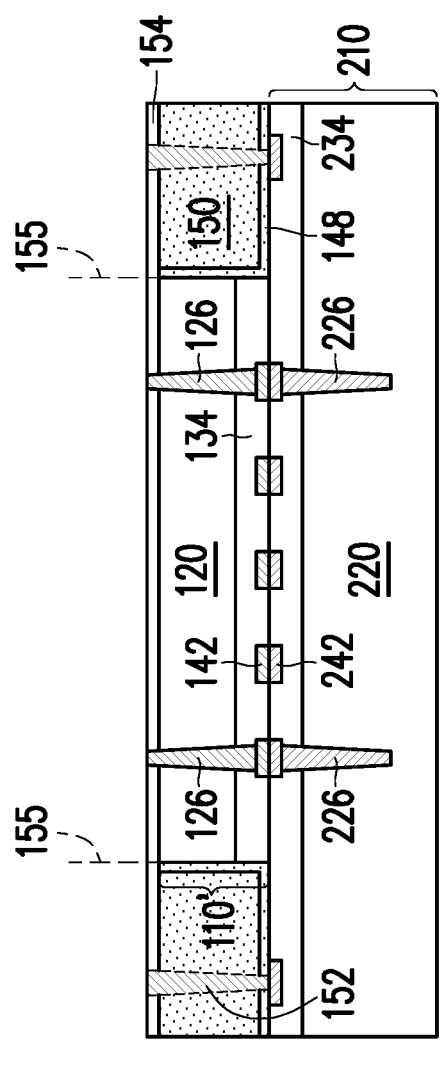

Next, as shown in FIG. 7, dielectric layer 154 is formed to embed the protruding portions of TSVs 126 therein. The respective process is illustrated as process 610 in the process flow 600 in FIG. 34. In accordance with some embodiments, dielectric layer 154 is formed by depositing a dielectric layer, which may be formed of silicon oxide, silicon nitride, or the like, and performing a planarization process to remove the excess portions of the dielectric material over TSVs 126, so that TSVs 126 are revealed. If isolation regions 151 are not recessed in preceding process, dielectric layer 154 will be limited in the region directly over substrate 120, with the edges 155 of dielectric layer 154 being flush with the respective edges of substrate 120. Accordingly, dielectric layer 154 will be between, and contact, the top portions of isolation regions 151.

Figure 8:
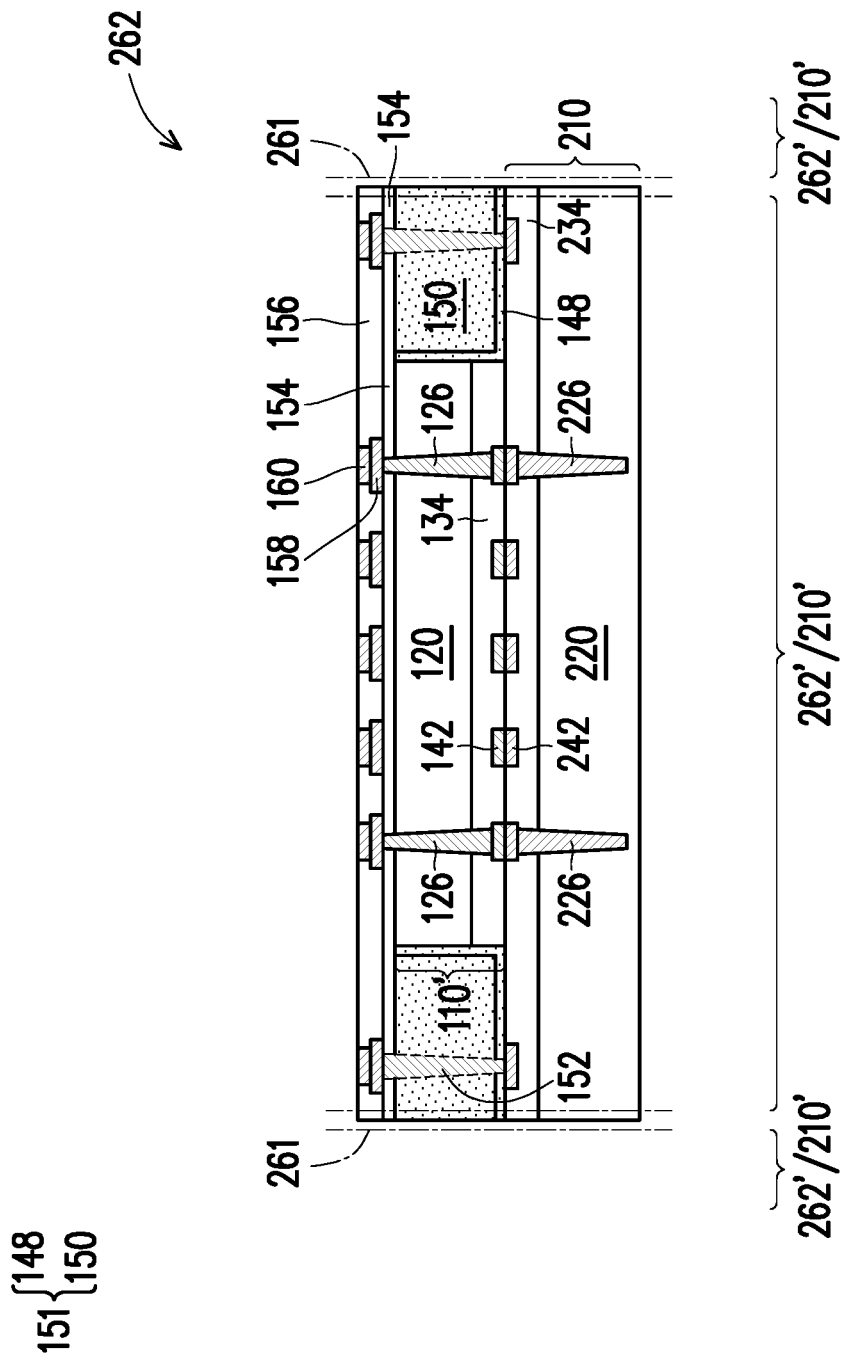

Referring to FIG. 8, dielectric layer(s) 156 and redistribution lines (RDLs) 158 are formed. The respective process is illustrated as process 612 in the process flow 600 in FIG. 34. Although one dielectric layer 156 and one RDL layer are shown as an example, more dielectric layers and RDLs may be formed. In accordance with some embodiments of the present disclosure, dielectric layer 156 is formed of a silicon-containing oxide (which may or may not include oxygen). For example, dielectric layer 156 may include an oxide such as silicon oxide, a nitride such as silicon nitride, or the like. RDLs 158 may be formed using a damascene process, which includes etching dielectric layer 156 to form openings, depositing a conductive barrier layer into the openings, plating a metallic material such as copper or a copper alloy, and performing a planarization to remove the excess portions of the metallic material. Alternatively, the formation of dielectric layer 156 and RDLs 158 may include forming dielectric layer 156, patterning dielectric layer 156 to form openings, forming a metal seed layer (not shown), forming a patterned plating mask (such as photo resist) to cover some portions of the metal seed layer, while leaving other portions exposed, plating the RDLs 158, removing the plating mask, and etching undesirable portions of the metal seed layer.

Bond pads 160 are further formed in dielectric layer 156. The respective process is also illustrated as process 612 in the process flow 600 in FIG. 34. The top surfaces of bond pads 160 are coplanar with the top surface of the surface dielectric layer 156. The planarization is achieved through a CMP process or a mechanical grinding process. Bond pads 160 may be formed of or comprise copper, for example. Throughout the description, wafer 210 and the overlying structures are collectively referred to as reconstructed wafer 262.

In accordance with some embodiments, wafer 210 is thinned by thinning semiconductor substrate 120 before the subsequent singulation process. The thinning may be performed through a planarization process such as a mechanical grinding process or a CMP process. The thinning may be stopped before TSVs 226 and the corresponding isolation layers are exposed. In accordance with other embodiments, no thinning process is performed before the subsequent singulation process.

FIG. 8 also illustrates a singulation process performed to singulate reconstructed wafer 262 into discrete packages 262'. The respective process is illustrated as process 614 in the process flow 600 in FIG. 34. The singulation is performed by cutting through scribe lines 261. Packages 262' are system packages. Wafer 210 is singulated as device dies 210'.

FIGS. 9 through 12 illustrate the intermediate stages in the bonding of package 262' to wafer 310 and the formation of additional features to form additional packages. In accordance with some embodiments, the formation process is similar to in FIGS. 3 and 8, wherein wafer 310 (FIG. 9) correspond to wafer 210 in FIG. 3, and package 262' correspond to device die 210' in FIG. 3. Unless specified otherwise, the like features in FIGS. 9 through 12 may (or may not) be formed using similar materials and similar processes as discussed referring to the processes shown in FIGS. 3 through 8.

Figure 9:
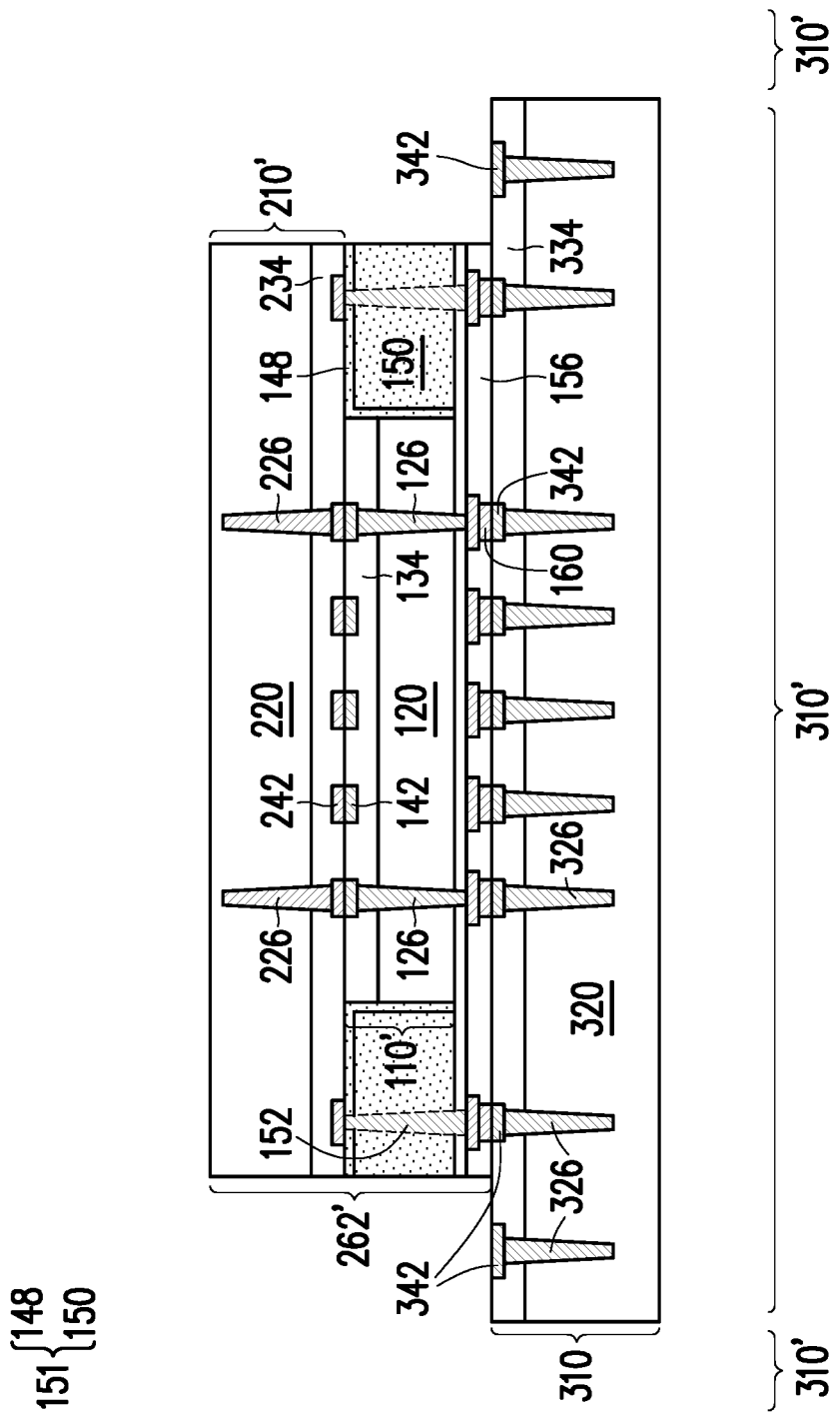

Referring to FIG. 9, packages 262' are bonded to wafer 310. The respective process is illustrated as process 616 in the process flow 600 in FIG. 34. Although one package 262' is illustrated, a plurality of packages 262' are bonded to the device dies 310' in wafer 310. The bonding of packages 262' to wafer 310 may be achieved through hybrid bonding, in which both metal-to-metal direct bonding (between bond pads 160 and 342) and dielectric-to-dielectric bonding (such as Si—O—Si bonding between surface dielectric layers 156 and 334) are formed. Furthermore, there may be a single or a plurality of package 262' bonded to the same device die 310'. The plurality of package 262' bonded to the same device die 310' may be identical to, or different from, each other to form a homogenous or a heterogeneous structure.

Figure 10:
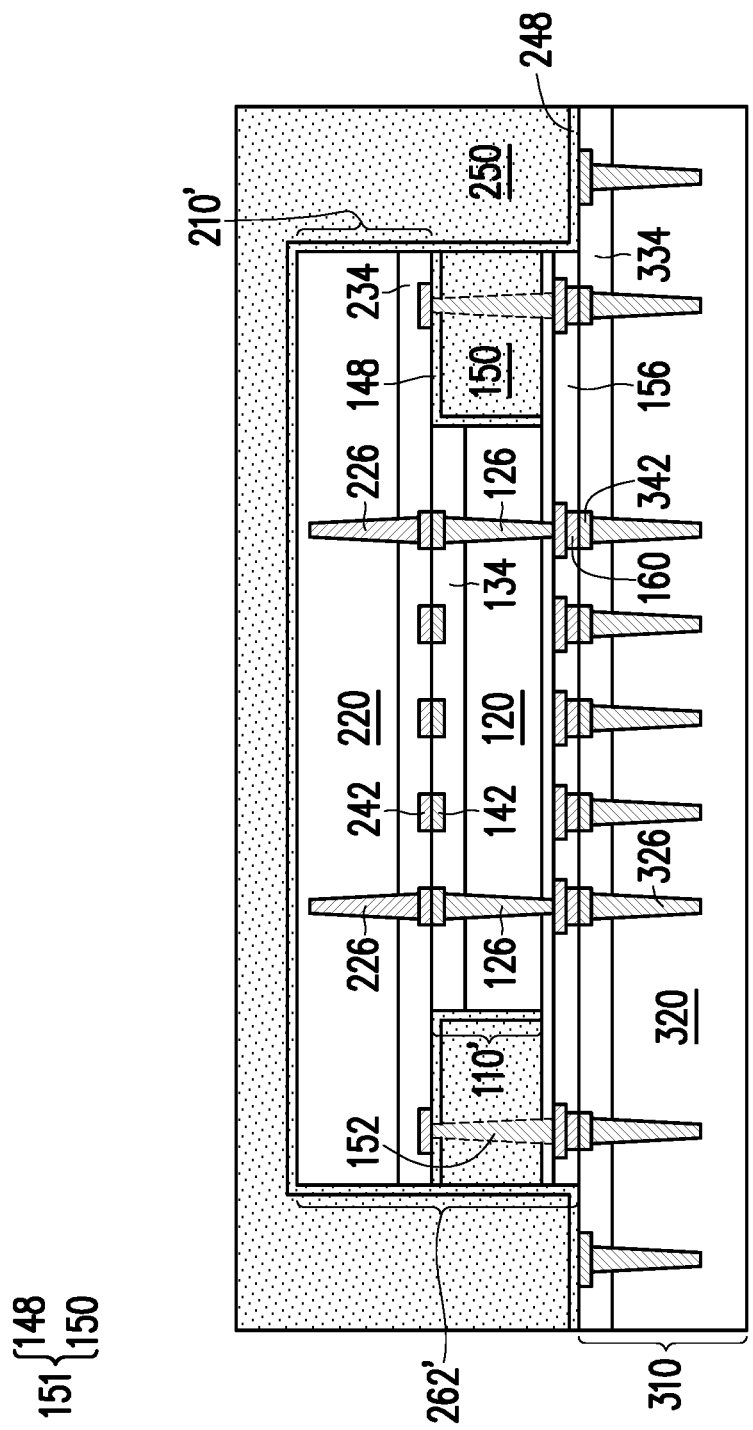
Figure 11:
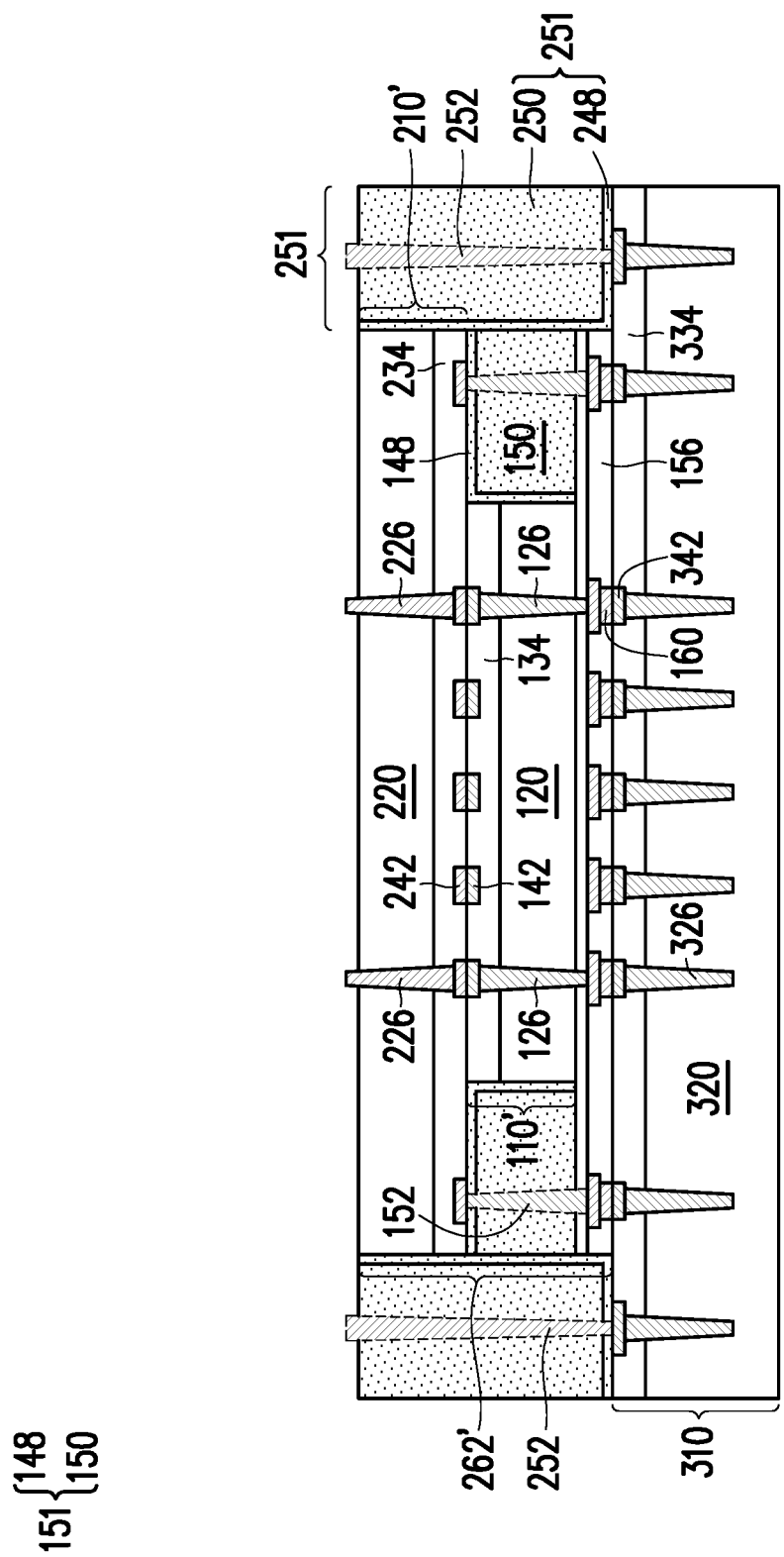

Next, as shown in FIG. 10, a gap-filling process is performed to encapsulate packages 262' in a dielectric material(s). The respective process is illustrated as process 618 in the process flow 600 in FIG. 34. After the dielectric materials are deposited, a planarization process is performed to level the top surfaces of device dies 210' with the top surface of the dielectric material. Isolation regions 251 are thus formed, as shown in FIG. 11. In accordance with some embodiments of the present disclosure, isolation regions 251 include etch stop layer 248 and dielectric region 250 over etch stop layer 248, which may adopt similar materials and methods for forming etch stop layer 148 and dielectric region 150, respectively. Alternatively, isolation regions 251 are formed of or comprise an encapsulant such as a molding compound, a molding underfill, a resin, an epoxy, or the like.

FIG. 11 further illustrates the formation of through-vias 352. The respective process is illustrated as process 620 in the process flow 600 in FIG. 34. The formation process may be similar to the formation of through-vias 152. In accordance with alternative embodiments, through-vias 252 are not formed. Accordingly, through-vias 252 are illustrated as being dashed to indicate they may be or may not be formed. The substrate 220 in device dies 210' may then be recessed, so that the top portions of TSVs 226 protrude over substrate 220. The respective process is illustrated as process 622 in the process flow 600 in FIG. 34. In the meantime, isolation regions 251 may be or may not be recessed. Isolation regions 251 may be or may not be recessed.

Figure 12:
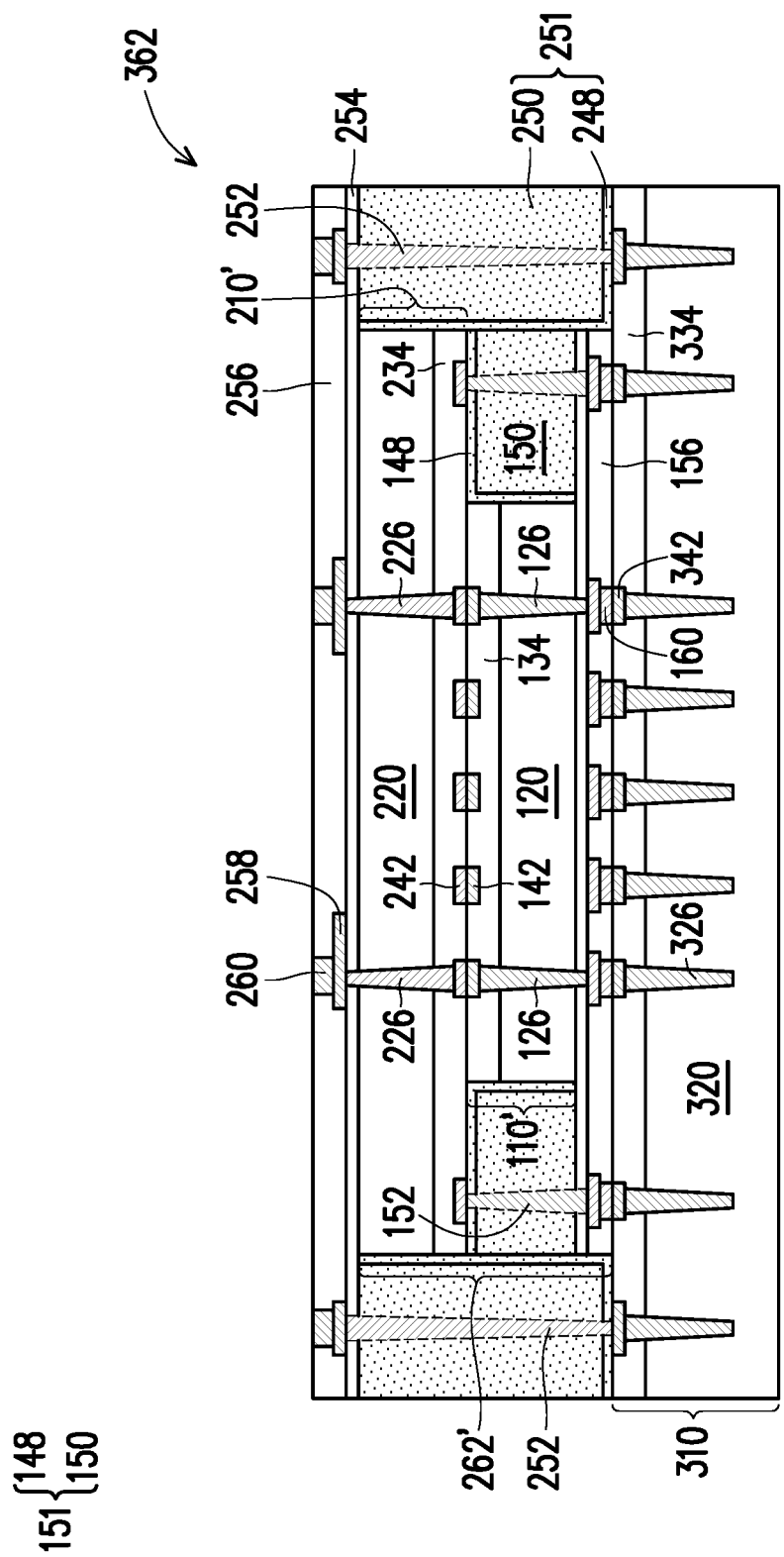

In subsequent processes, as shown in FIG. 12, dielectric layers 254 and 256, RDLs 258, and bond pads 260 are formed. The respective process is illustrated as process 624 in the process flow 600 in FIG. 34. The formation processes and the materials of dielectric layers 254 and 256, RDLs 258, and bond pads 260 may be similar to that of dielectric layers 154 and 156, RDLs 158, and bond pads 160, respectively, and are not repeated herein. Throughout the description, wafer 310 and the overlying structures are collectively referred to as reconstructed wafer 362. Dielectric layer 254 may be limited directly over substrate 220, or may extend directly over isolation regions 251, as illustrated in FIG. 12.

Figure 13:
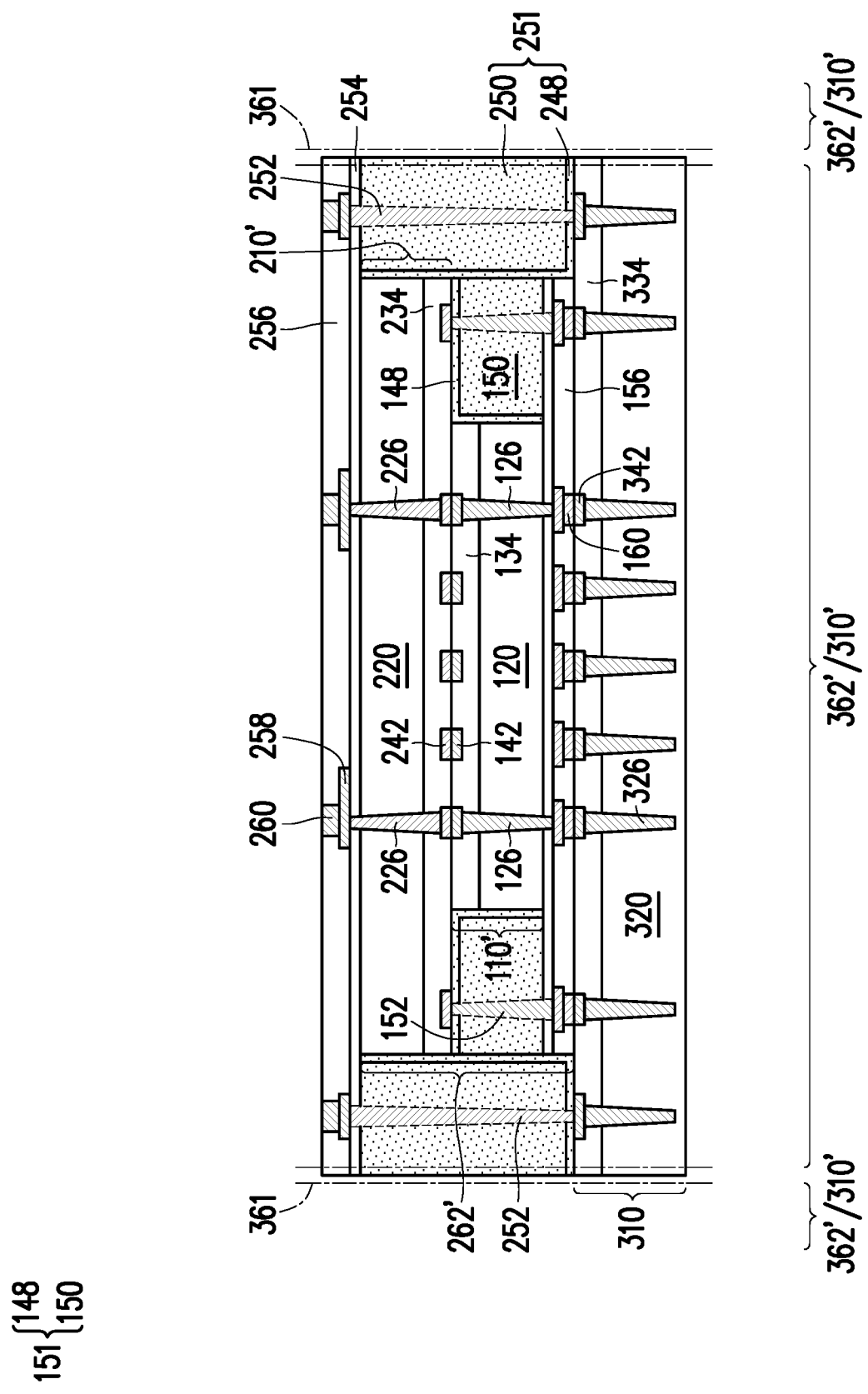

In accordance with some embodiments, reconstructed wafer 362 is thinned by thinning semiconductor substrate 320, for example, through a planarization process such as a mechanical grinding process or a CMP process. The resulting structure is shown in FIG. 13. The thinning may be stopped before TSVs 326 and the corresponding isolation layers are exposed.

FIG. 13 also illustrates a singulation process performed to singulate reconstructed wafer 362 into discrete packages 362'. The respective process is illustrated as process 626 in the process flow 600 in FIG. 34. The singulation is performed by cutting through scribe lines 361. Packages 362' are also system packages, which further include pre-formed packages 262' therein. In accordance with some embodiments, no more device dies are bonded to packages 262', and packages 262' may be used for the packaging processes as shown in FIGS. 27 through 33. In which embodiments, there may not be TSVs formed in semiconductor substrate 320. In accordance with other embodiments, more device dies are bonded to packages 362', as shown in FIGS. 14 through 18.

FIGS. 14 through 18 illustrate the intermediate stages in the bonding of package 362' to wafer 410 and the formation of additional features to form additional packages. The respective process is illustrated as process 628 in the process flow 600 in FIG. 34. The bonding of packages 362' to wafer 410 may be achieved through hybrid bonding, in which both metal-to-metal direct bonding (between bond pads 260 and 442) and dielectric-to-dielectric bonding (such as Si—O—Si bonding between surface dielectric layers 256 and 434) are formed. Unless specified otherwise, the like features in FIGS. 14 through 18 may be (or may not be) formed using similar materials and similar processes as discussed referring to the processes shown in FIGS. 9 through 13.

Figure 14:
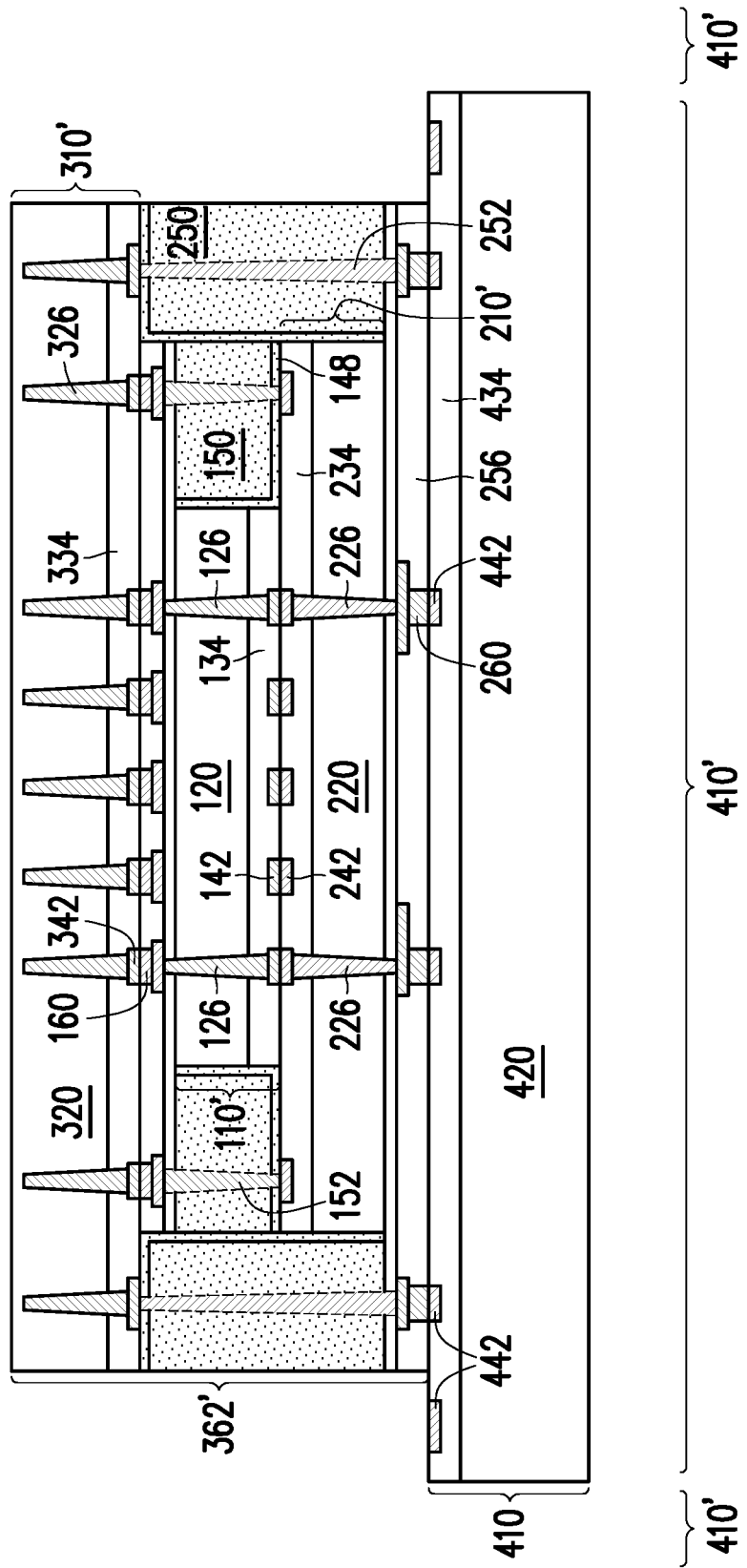

Referring to FIG. 14, packages 362' are bonded to wafer 410. Although one package 362' is illustrated, a plurality of packages 362' are bonded to the device dies 410' in wafer 410. Furthermore, there may be a single or a plurality of package 362' bonded to the same device die 410'. The plurality of packages 362' or device dies (not in packages) bonded to the same device die 410' may be identical to, or different from, each other to form a homogenous or heterogeneous structure. In accordance with some embodiments of the present disclosure, wafer 410 does not include TSVs in semiconductor substrate 420.

Figure 15:
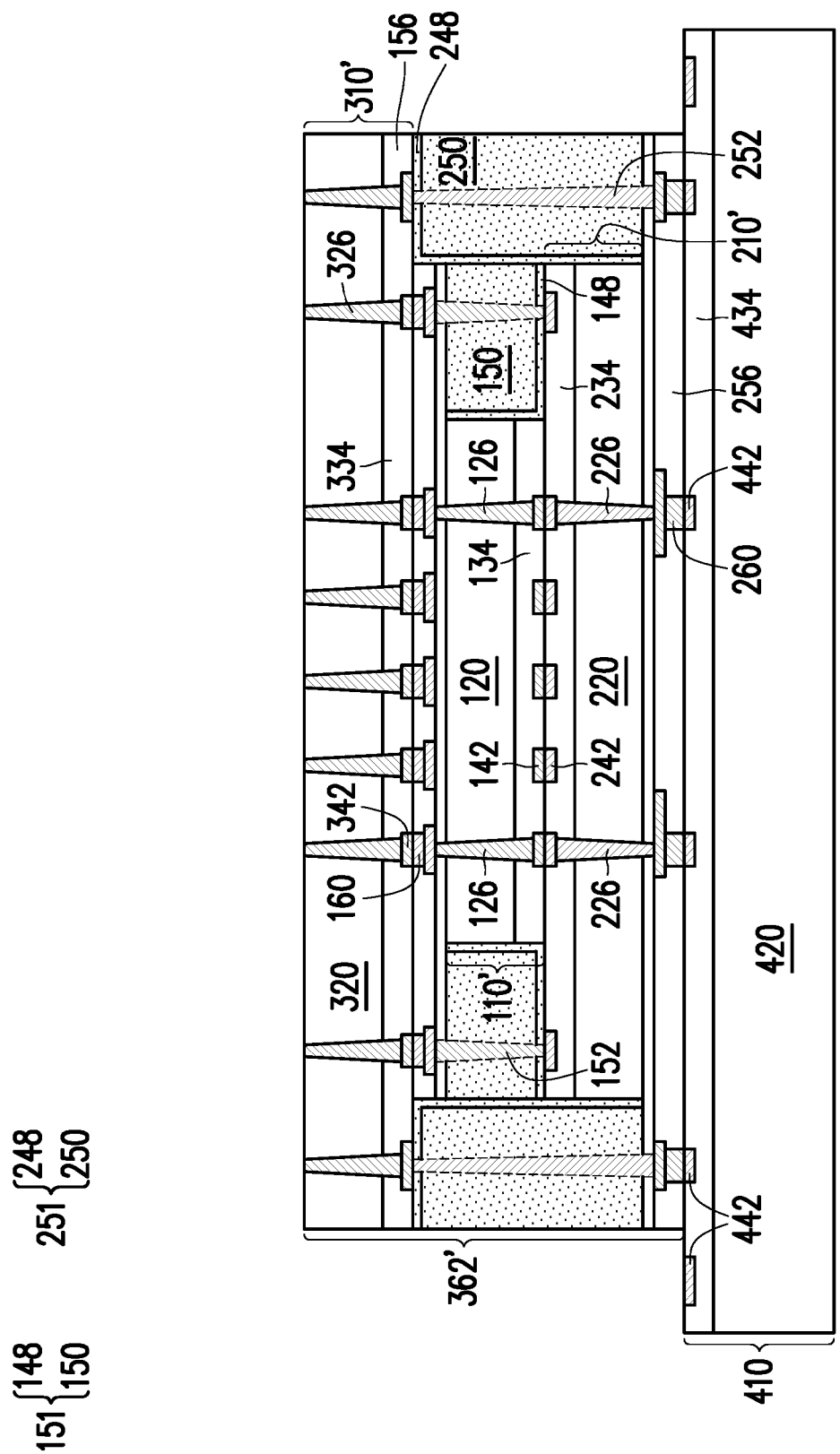
Figure 16:
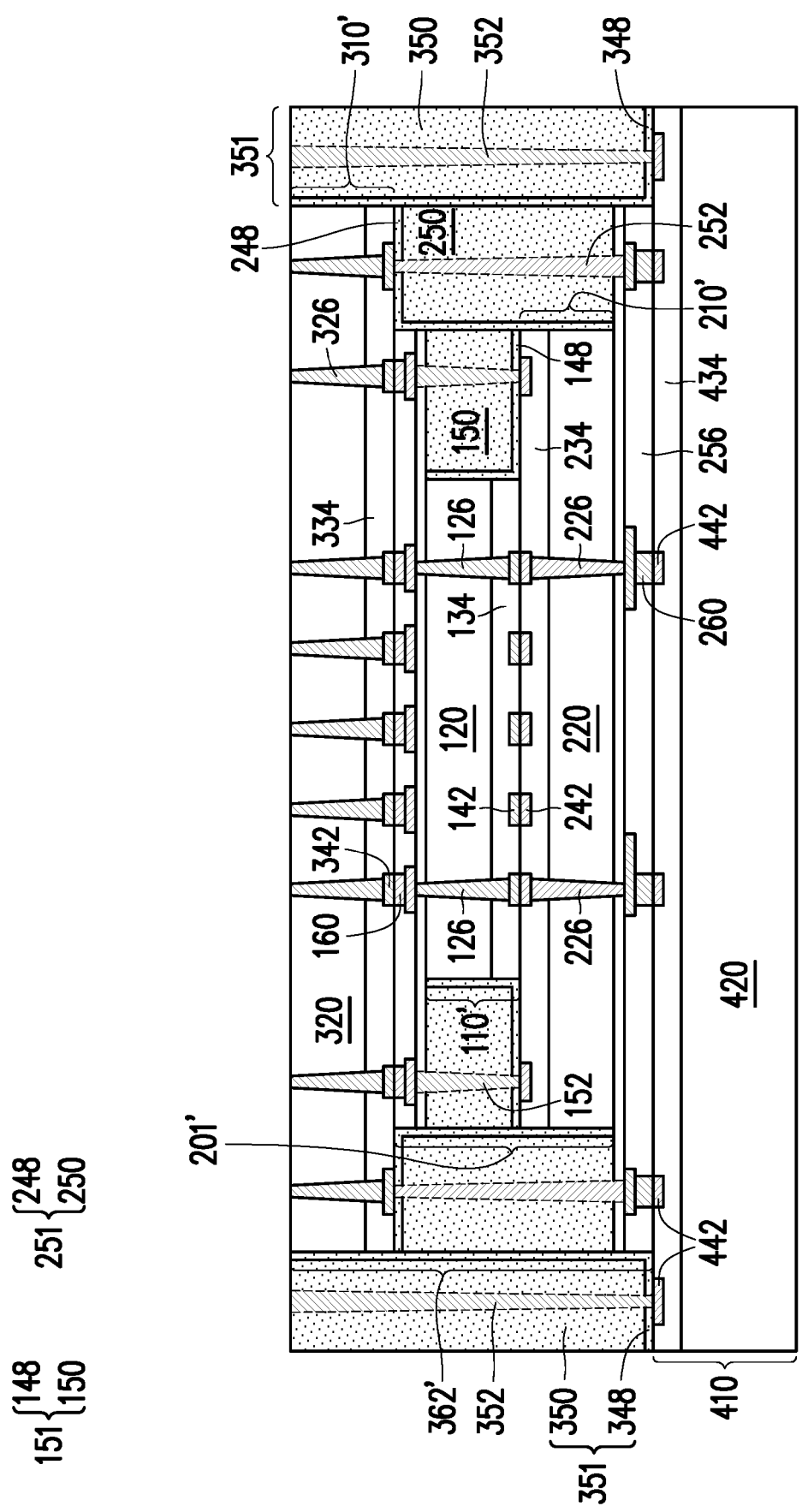

Next, as shown in FIG. 15, semiconductor substrate 320 is thinned to reveal TSVs 326. In FIG. 16, a gap-filling process is performed to encapsulate packages 362' in isolation regions 351, which may include etch stop layer 348 and dielectric region 350 over etch stop layer 348. Alternatively, isolation regions 351 may include a molding compound, a molding underfill, a resin, an epoxy, or the like. Through-vias 352 may then be formed in accordance with some embodiments. In accordance with alternative embodiments, through-vias 352 are not formed. Accordingly, through-vias 352 are illustrated as dashed to indicate they may be or may not be formed.

Figure 17:
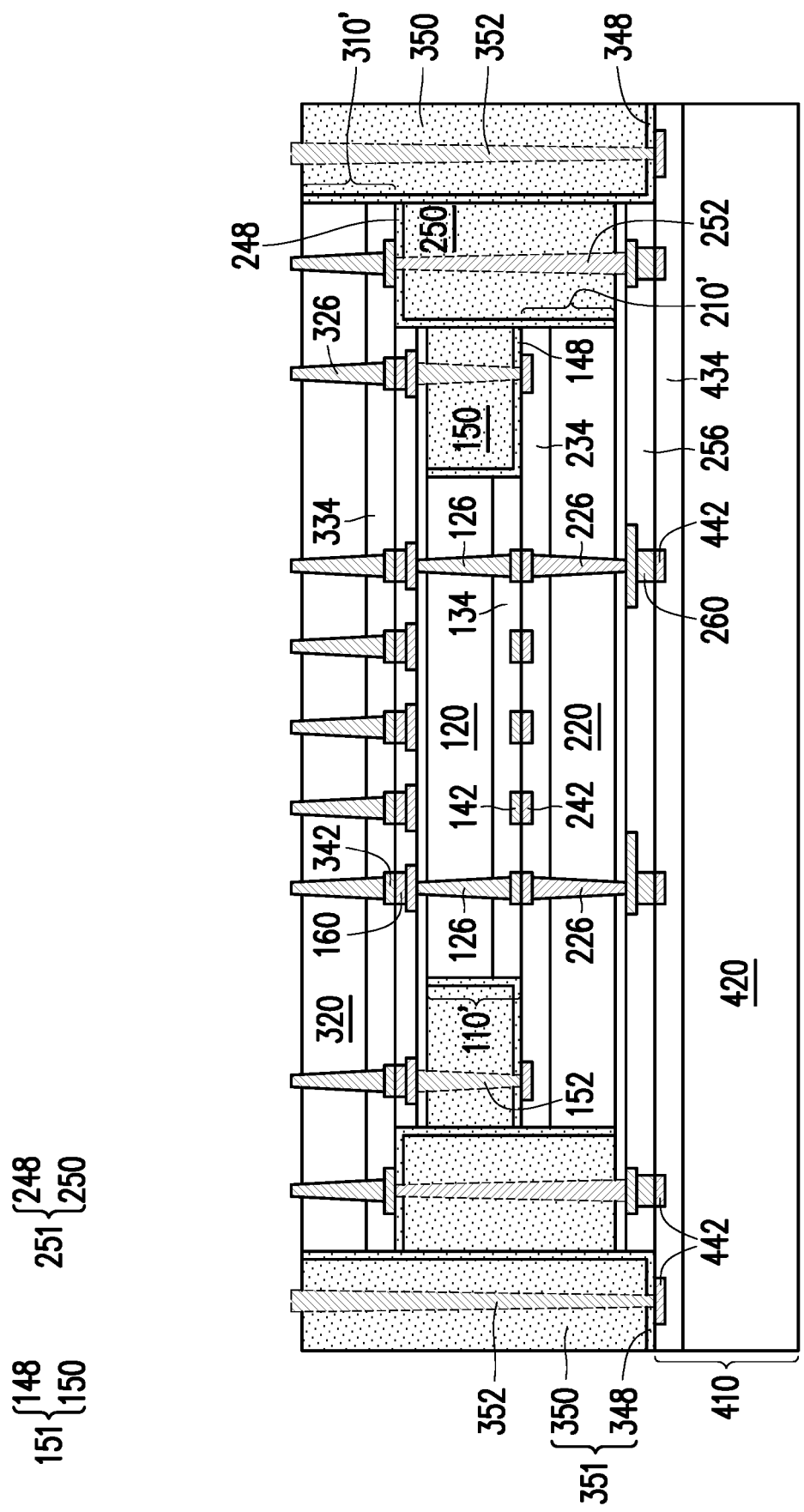
Figure 18:
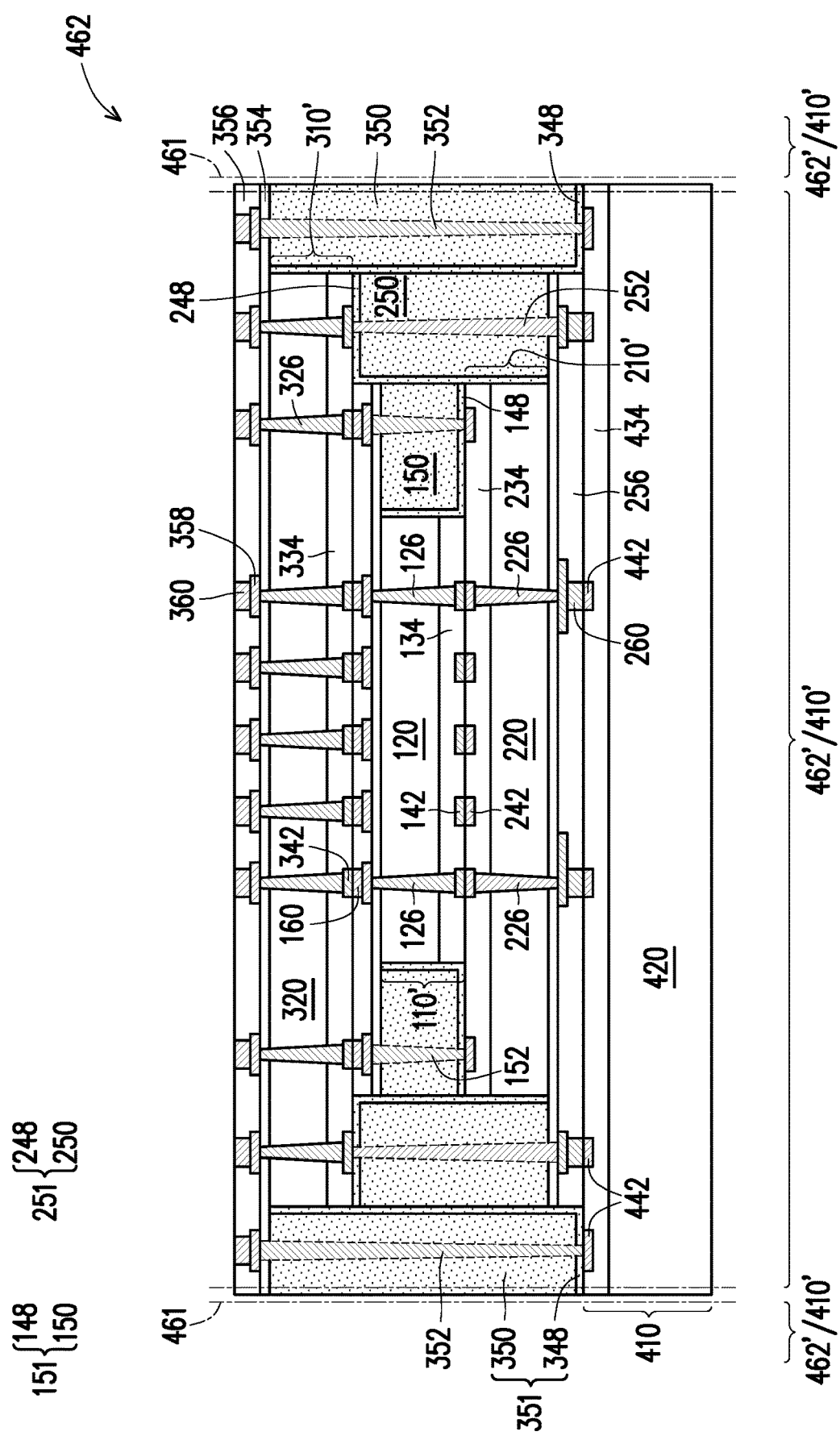

In subsequent processes, as shown in FIG. 17, semiconductor substrate 320 is recessed slightly so that the top portions of TSVs 326 protrude out of semiconductor substrate 320. Next, as shown in FIG. 18, dielectric layers 354 and 356, RDLs 358, and bond pads 360 are formed. The formation processes and the materials of dielectric layers 354 and 356, RDLs 358, and bond pads 360 may be similar to that of dielectric layers 154 and 156, RDLs 158, and bond pads 160, respectively, and are not repeated herein. Throughout the description, wafer 410 and the overlying structures are collectively referred to as reconstructed wafer 462. In accordance with some embodiments, reconstructed wafer 462 is thinned by thinning semiconductor substrate 420 through a planarization process.

FIG. 18 also illustrates a singulation process performed to singulate reconstructed wafer 462 into discrete packages 462'. The singulation is performed by cutting through scribe lines 461. Throughout the description, packages 462' are alternatively referred to as SoIC packages 462'. Packages 462' include pre-formed packages 362', which further include pre-formed packages 262' therein. In accordance with some embodiments, no more device dies are further bonded to packages 462', and the resulting package may be used for the packaging processes as shown in FIGS. 27 through 33. In accordance with other embodiments, more device dies are bonded, as shown in FIGS. 19 through 22.

FIGS. 19 through 22 illustrate the intermediate stages in the bonding of package 462' to wafer 510 and the formation of additional features to form additional packages. The respective process is illustrated as process 630 in the process flow 600 in FIG. 34. The bonding of packages 462' to wafer 510 may be achieved through hybrid bonding, in which both metal-to-metal direct bonding (between bond pads 360 and 542) and dielectric-to-dielectric bonding (such as Si—O—Si bonding between surface dielectric layers 356 and 534) are formed. Unless specified otherwise, the like features in FIGS. 19 through 22 may be (or may not be) formed using similar materials and similar processes as discussed referring to the processes shown in FIGS. 14 through 18.

Figure 19:
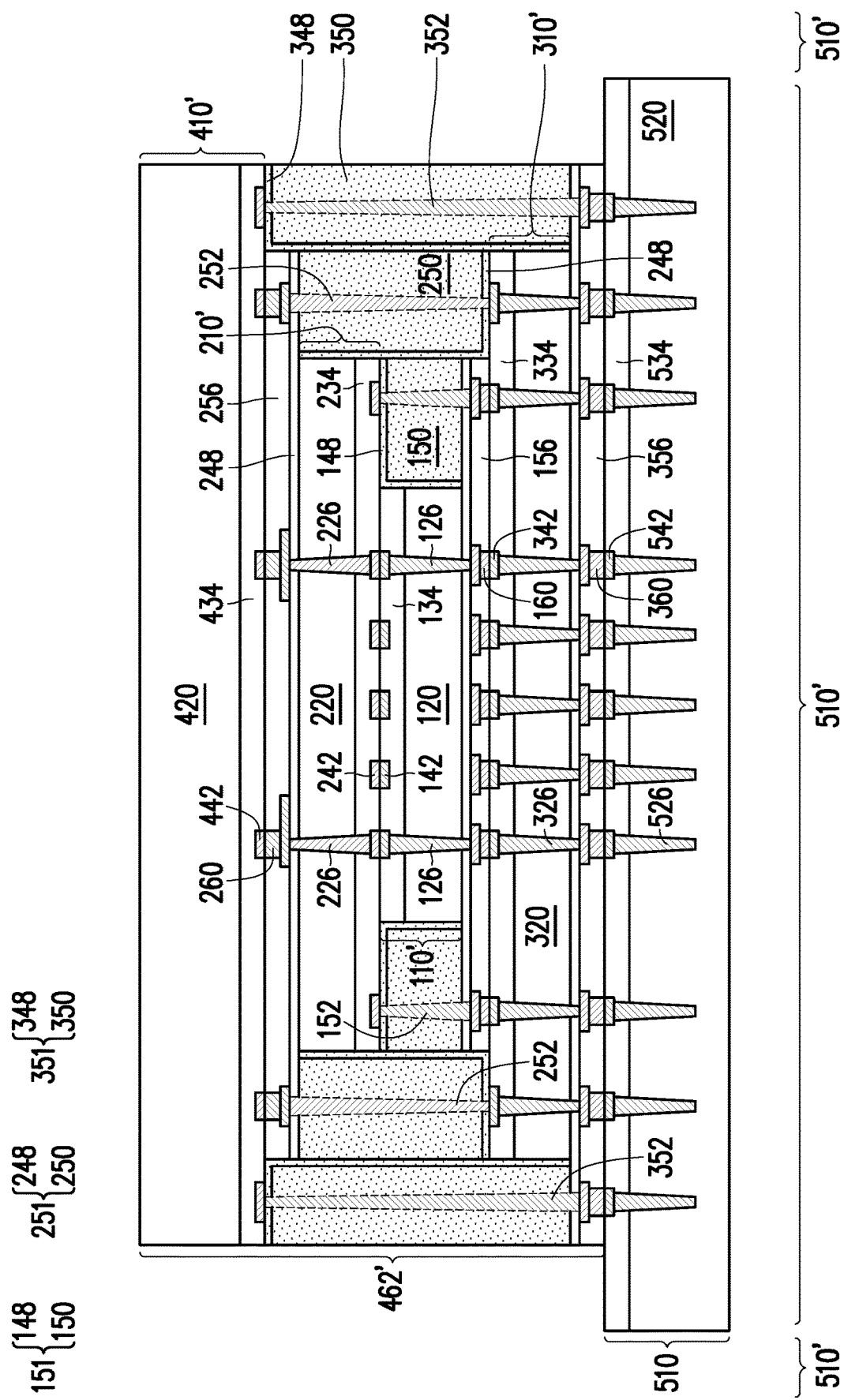

Referring to FIG. 19, packages 462' are bonded to wafer 510. Although one package 462' is illustrated, a plurality of packages 462' are bonded to the device dies 510' in wafer 510. Furthermore, there may be a single or a plurality of package 462' bonded to the same device die 510' to form a homogenous structure or a heterogeneous structure.

Figure 20:
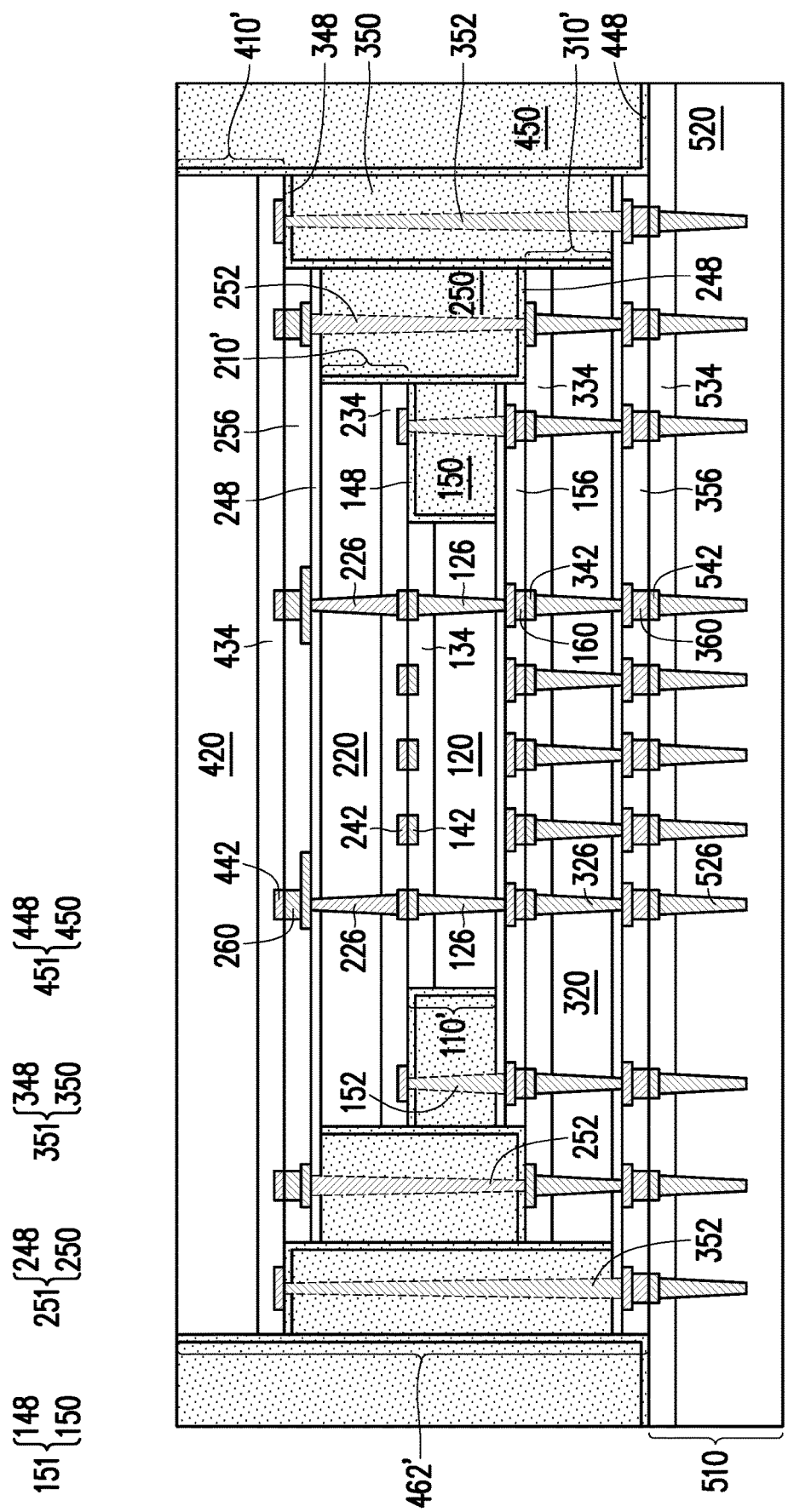

Next, as shown in FIG. 20, semiconductor substrate 420 is further thinned, and packages 462' are encapsulated in a dielectric material(s) to form gap-filling regions 451, which may include etch stop layer 448 and dielectric region 450 over etch stop layer 448, or may include an encapsulant such as a molding compound, a molding underfill, a resin, an epoxy, or the like.

Figure 21:
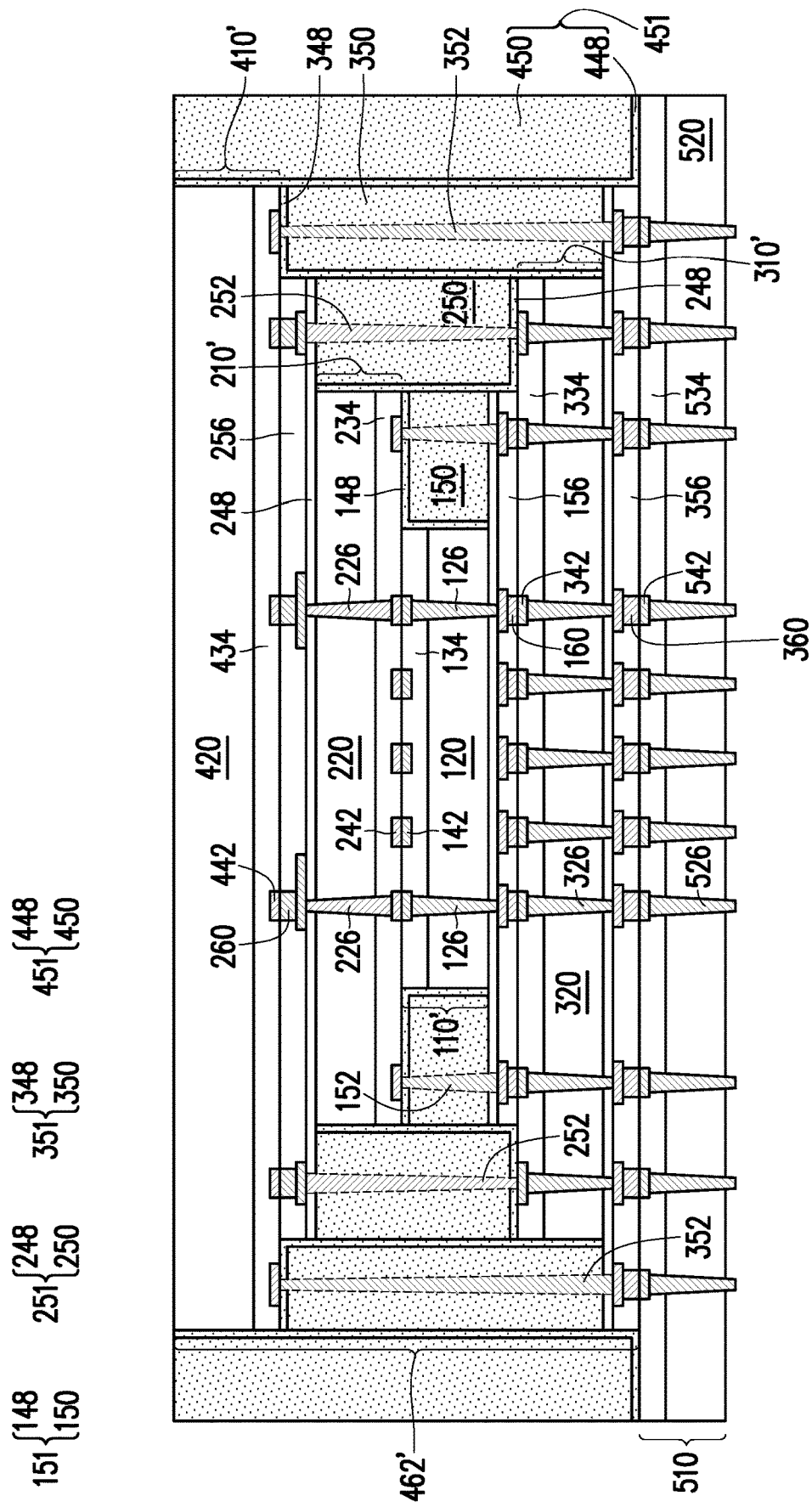
Figure 22:
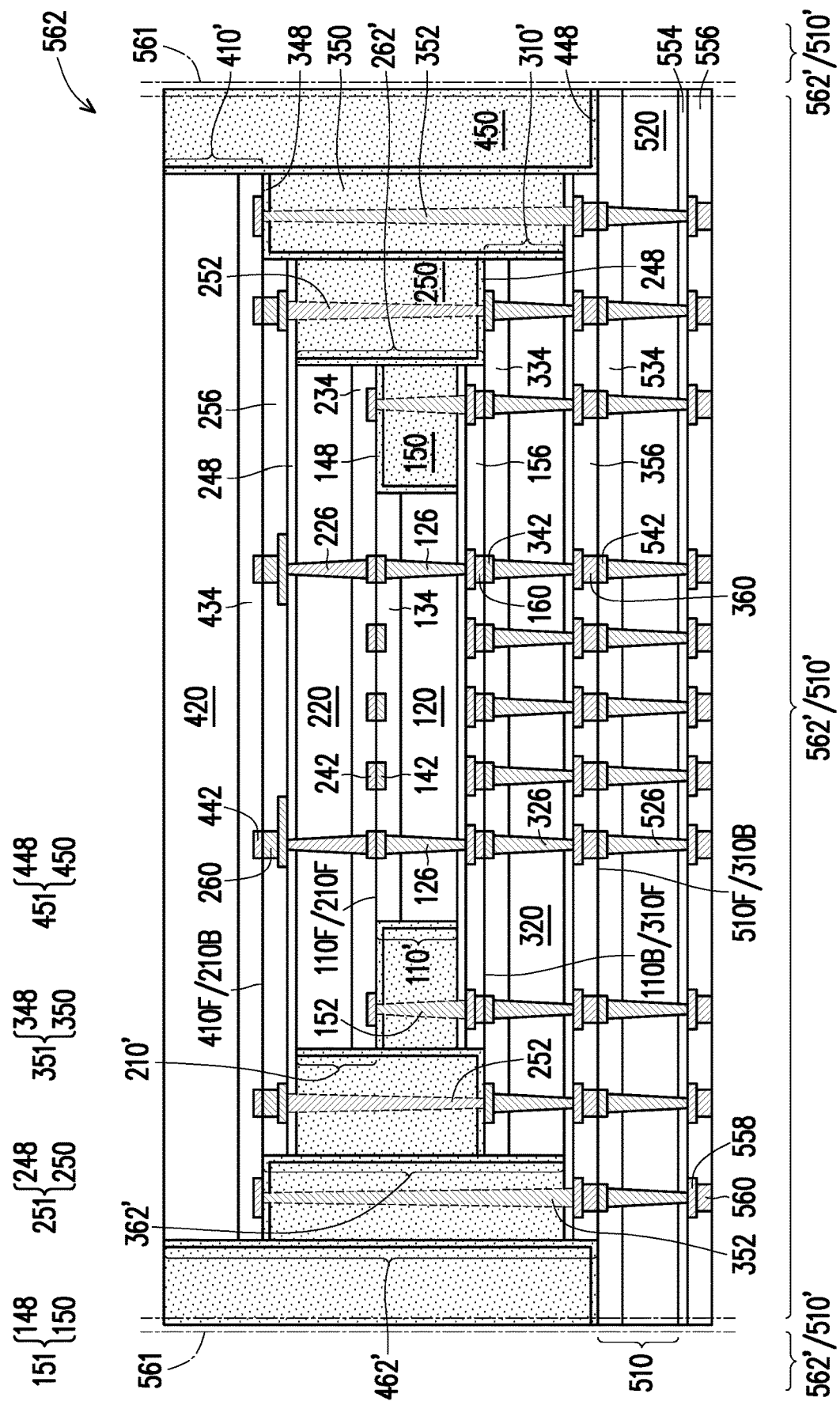

In subsequent processes, as shown in FIG. 21, semiconductor substrate 520 is recessed slightly so that TSVs 526 protrude out of semiconductor substrate 520. Next, as shown in FIG. 22, dielectric layers 554 and 556, RDLs 558, and bond pads 560 are formed. The formation processes and the materials of dielectric layers 554 and 556, RDLs 558, and bond pads 560 may be similar to that of dielectric layers 154 and 156, RDLs 158, and bond pads 160, respectively, and are not repeated herein. Throughout the description, wafer 510 and the overlying structures are collectively referred to as reconstructed wafer 562.

FIG. 22 also illustrates a singulation process performed to singulate reconstructed wafer 562 into discrete packages 562'. The singulation is performed by cutting through scribe lines 561. Throughout the description, packages 562' are alternatively referred to as SoIC packages 562'. Packages 562' include pre-formed packages 462', which further include pre-formed packages 362' and 262' therein. In accordance with some embodiments, the bonding of further device dies may be stopped, and the resulting package may be used for the packaging processes as shown in FIGS. 27 through 33. In accordance with other embodiments, more device dies are bonded.

In accordance with some embodiments of the present disclosure, the front surface 110F of device die 110' and the front surface 210F of device die 210' are bonded to each other. The backside of device die 110' faces the front side of device die 310', as indicated by interface 110B/310F. The front side of device die 410' faces the backside of device die 210', as indicated by interface 410F/210B. The front side of device die 510' faces the backside of device die 310', as indicated by interface 510F/310B. This bonding scheme is caused by starting from die 110', and bonding dies alternatingly on the front side and the back side of die 110'. Such a way of bonding has an advantageous feature since the bonded wafer in each bonding step (such as shown in FIGS. 3, 9, 14, and 19) may be used as the carrier for the formation of the respective packages, so that no additional carriers are needed. In accordance with some embodiments of the present disclosure, instead of bonding to the front side and the back side of die 110' alternatingly, other bonding schemes may be use.

In the embodiments shown in FIGS. 3 through 22, the bonding pads for the external connection of package 562' are formed on the device die 510', which is the last bonded die. In accordance with alternative embodiments, the bonding pads for the external connection of package 562' are formed on the device die 410', which is bonded before the last die is bonded. The corresponding formation process is illustrated in FIGS. 23 through 26. Unless specified otherwise, the materials and the formation processes of the components in these embodiments are essentially the same as the like components, which are denoted by like reference numerals in the preceding embodiments shown in FIGS. 3 through 22. The details regarding the formation process and the materials of the components shown in FIGS. 23 through 26 may thus be found in the discussion of the preceding embodiments.

Figure 23:
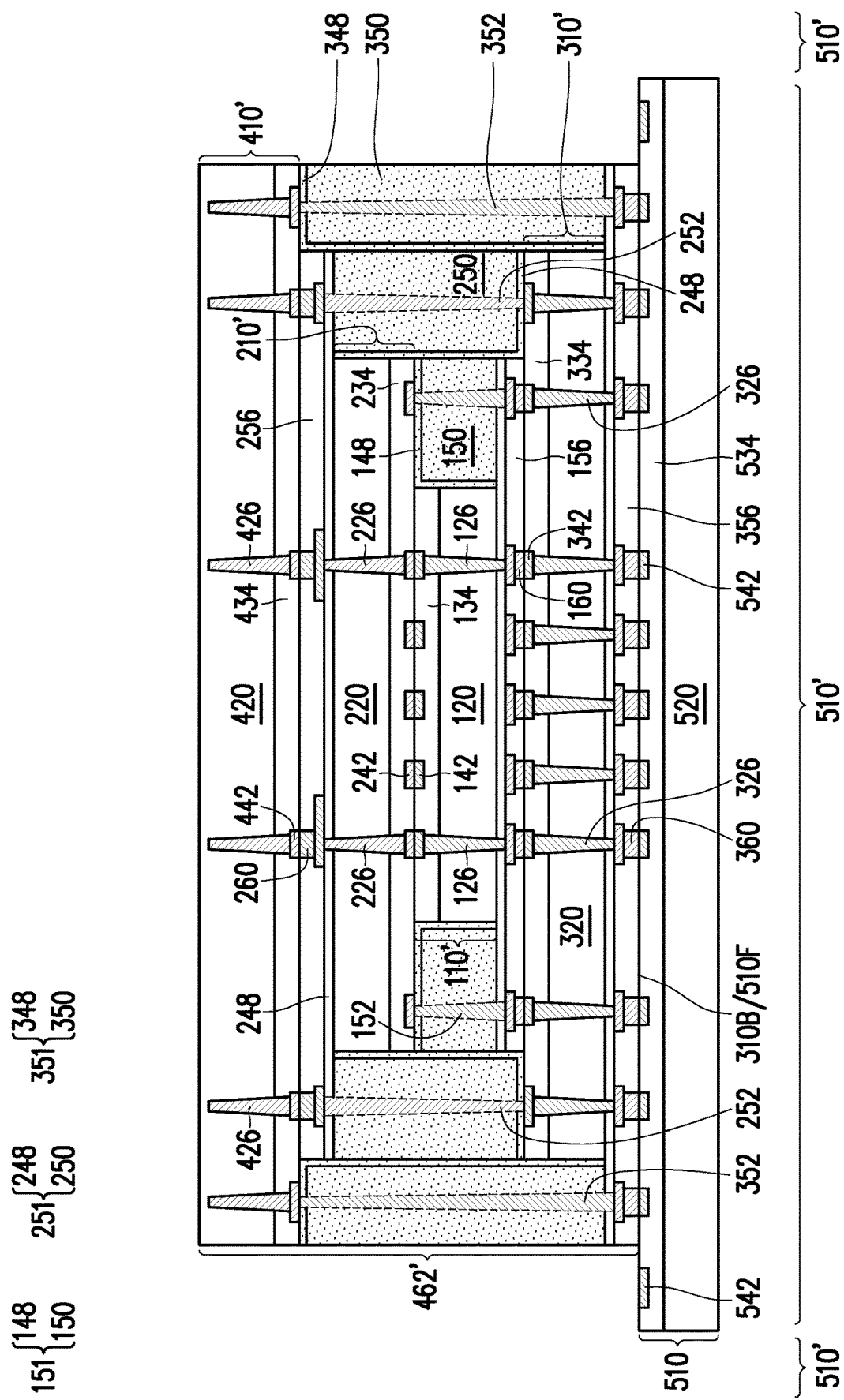
FIGS. 23 through 26 are cross-sectional views of intermediate stages in the formation of a package in accordance with some embodiments.

FIG. 23 illustrates package 462', which is essentially the same as the package 462' shown in FIG. 18, except in FIG. 23, TSVs 426 are formed in device die 410'. Packages 462' are bonded to wafer 510 through hybrid bonding, with bonding pads 360 bonded to bond pads 542, and dielectric layers 356 and 534 bonded through fusion bonding. Wafer 510 is free from TSVs extending into the corresponding semiconductor substrate 520.

Figure 24:
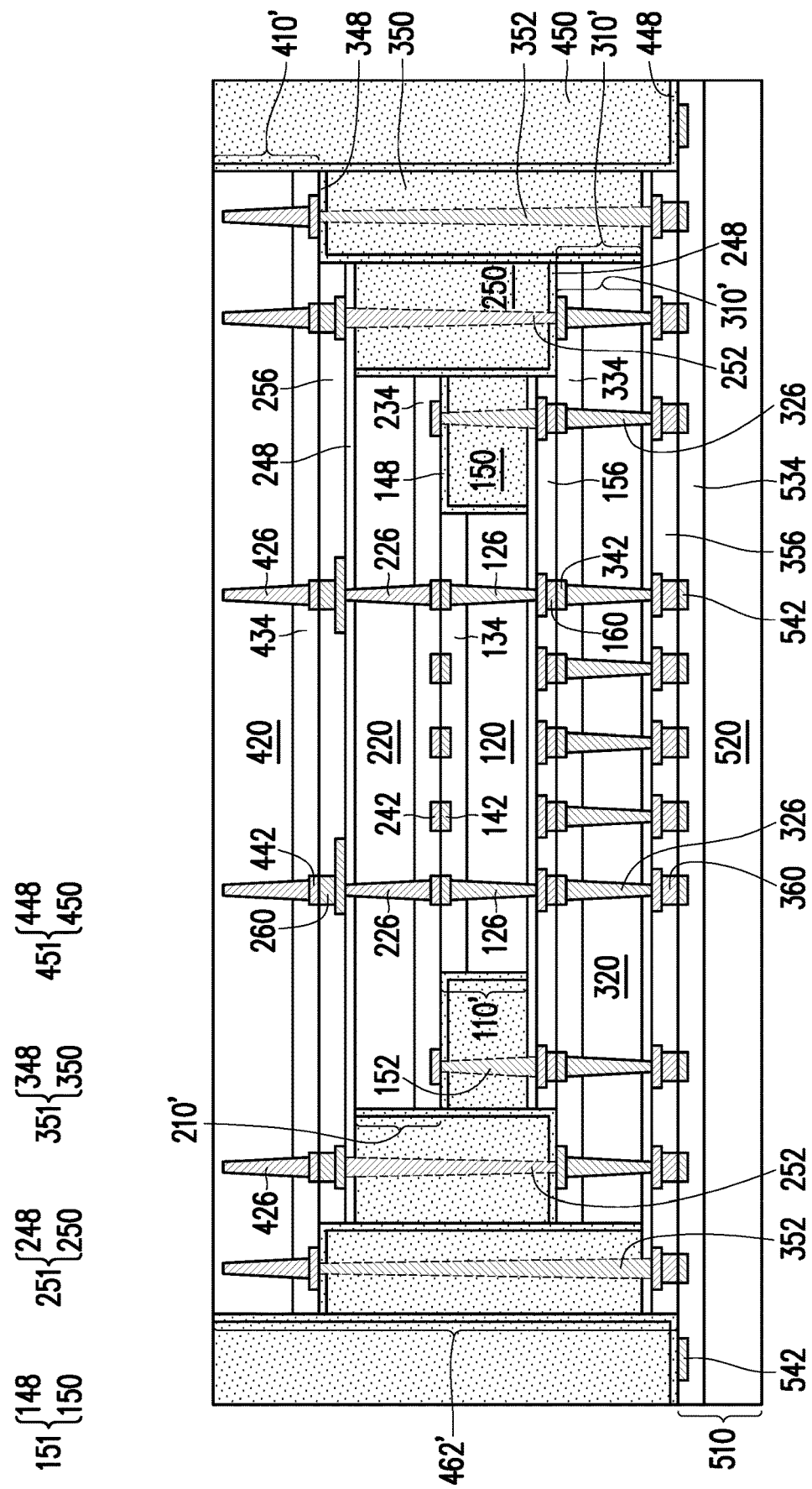

Next, as shown in FIG. 24, semiconductor substrate 420 is thinned, and packages 462' are encapsulated in a dielectric material(s) to form isolation regions 451, which may include etch stop layer 448 and dielectric region 450 over etch stop layer 448, or may include an encapsulant such as a molding compound, a molding underfill, a resin, an epoxy, or the like.

Figure 25:
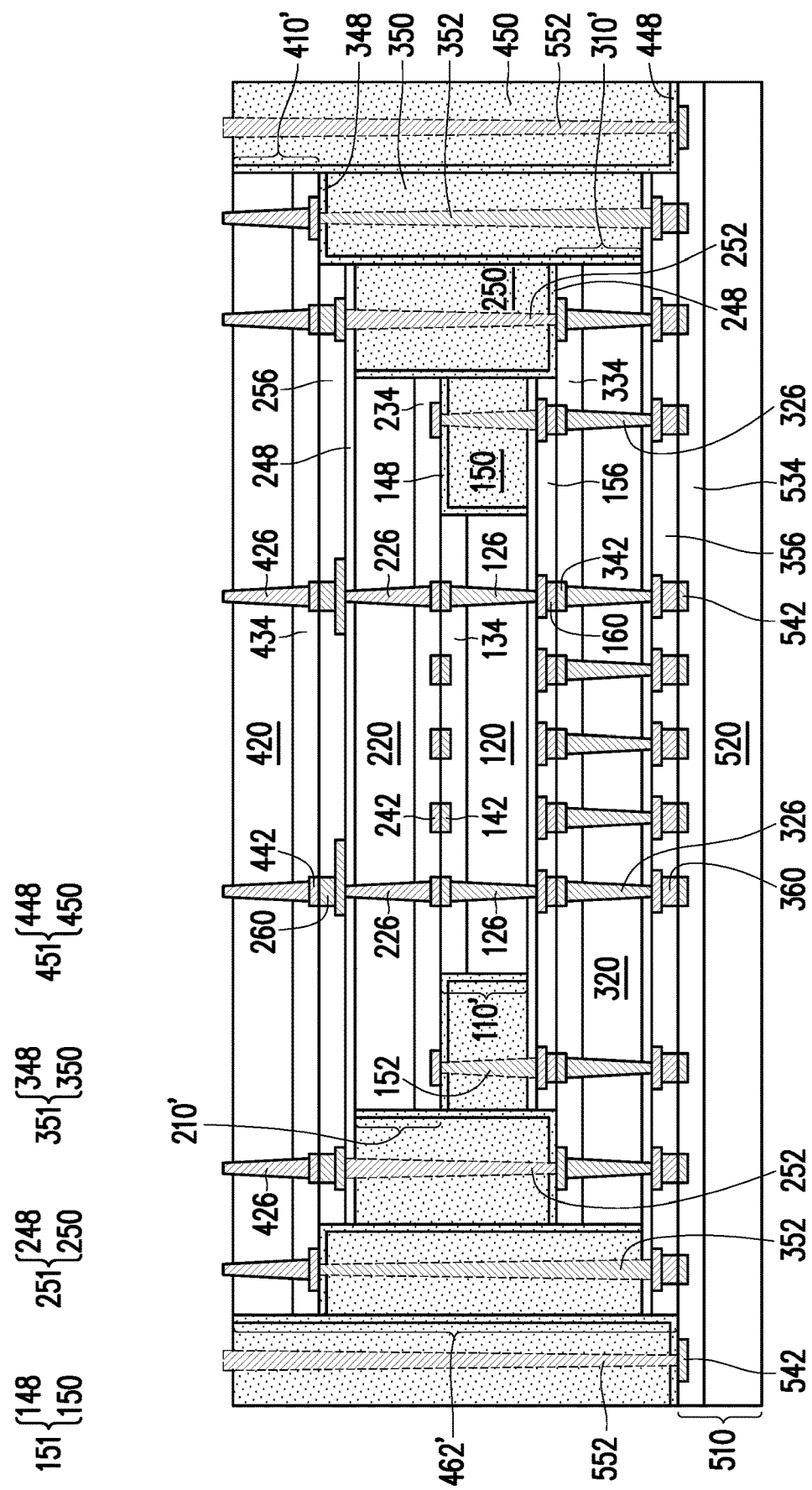
Figure 26:
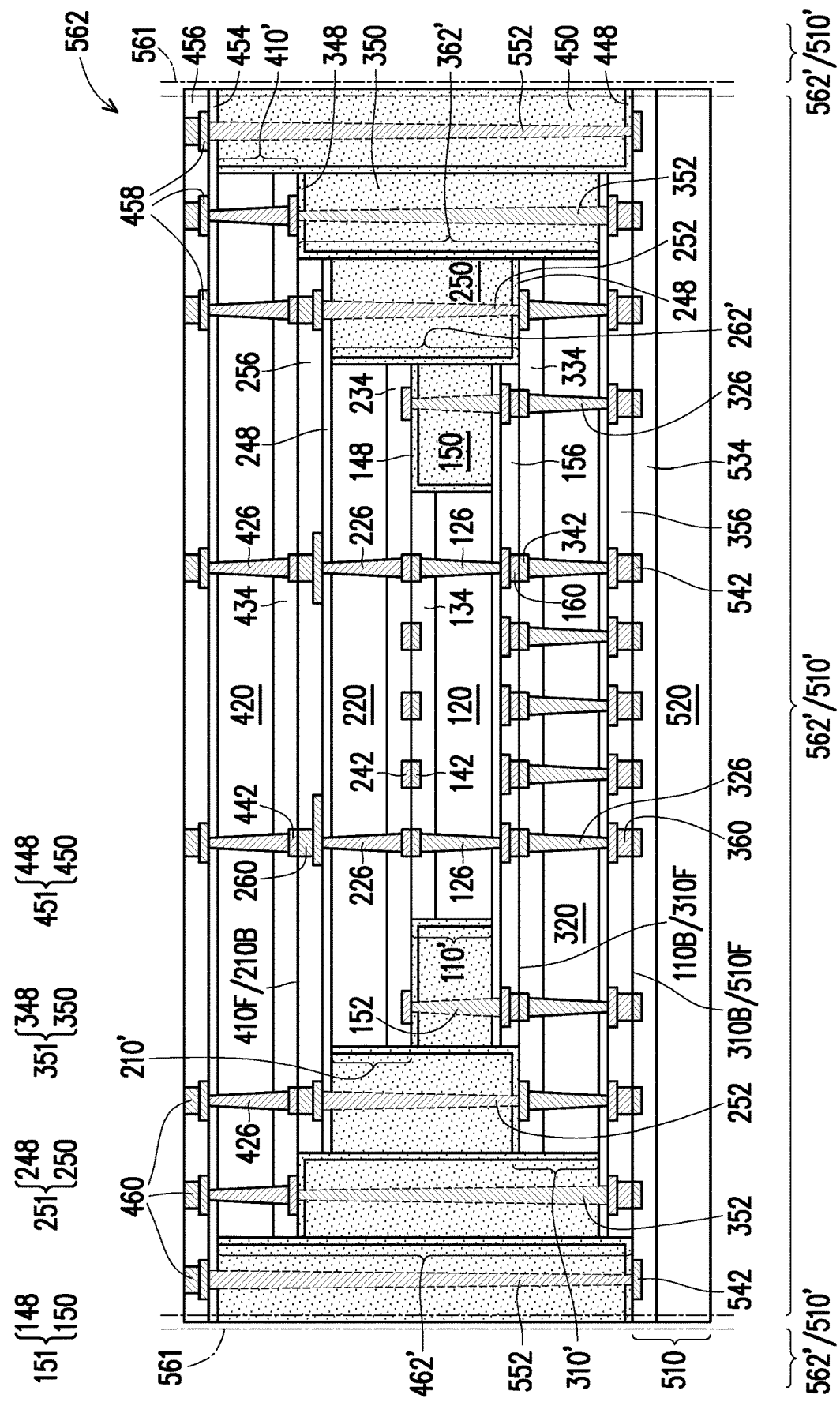

In subsequent processes, as shown in FIG. 25, semiconductor substrate 420 is recessed slightly so that TSVs 426 protrude out of semiconductor substrate 420. Isolation regions 451 may be, or may not be, recessed. Next, as shown in FIG. 26, dielectric layers 454 and 456, RDLs 458, and bond pads 460 are formed. Through-vias 552 may be (or may not be) formed. Throughout the description, wafer 510 and the overlying structures are collectively referred to as reconstructed wafer 562. In accordance with some embodiments, reconstructed wafer 562 is thinned by thinning semiconductor substrate 520 through a planarization process.

FIG. 26 also illustrates a singulation process performed to singulate reconstructed wafer 562 into discrete packages 562'. The singulation is performed by cutting through scribe lines 561. In accordance with some embodiments, the bonding of further device dies may be stopped, and the resulting package may be used for the packaging processes as shown in FIGS. 27 through 33. In accordance with other embodiments, more device dies are bonded.

Figure 27:
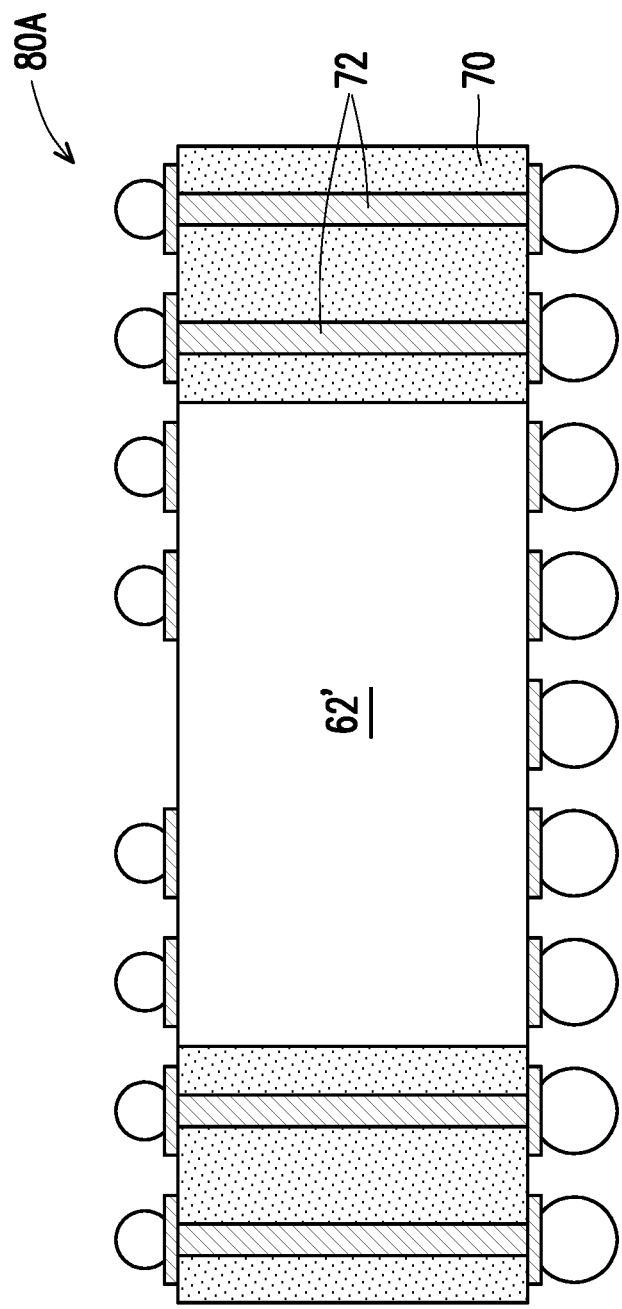
FIGS. 27 through 33 illustrate some applications for the packages formed in accordance with some embodiments.
Figure 28:
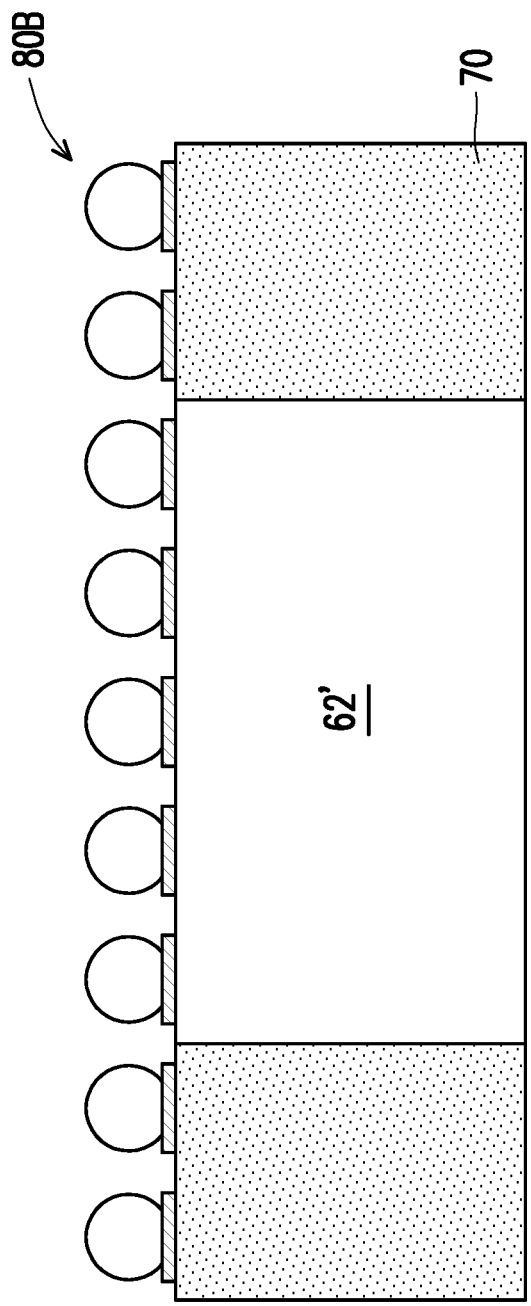
Figure 29:
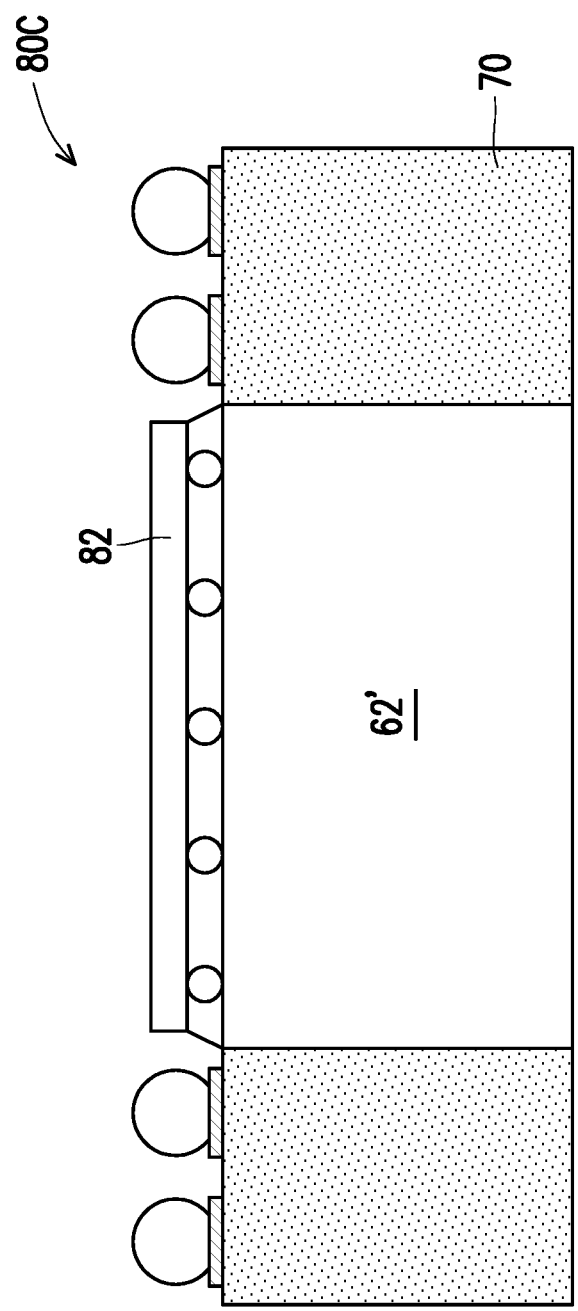
Figure 30:
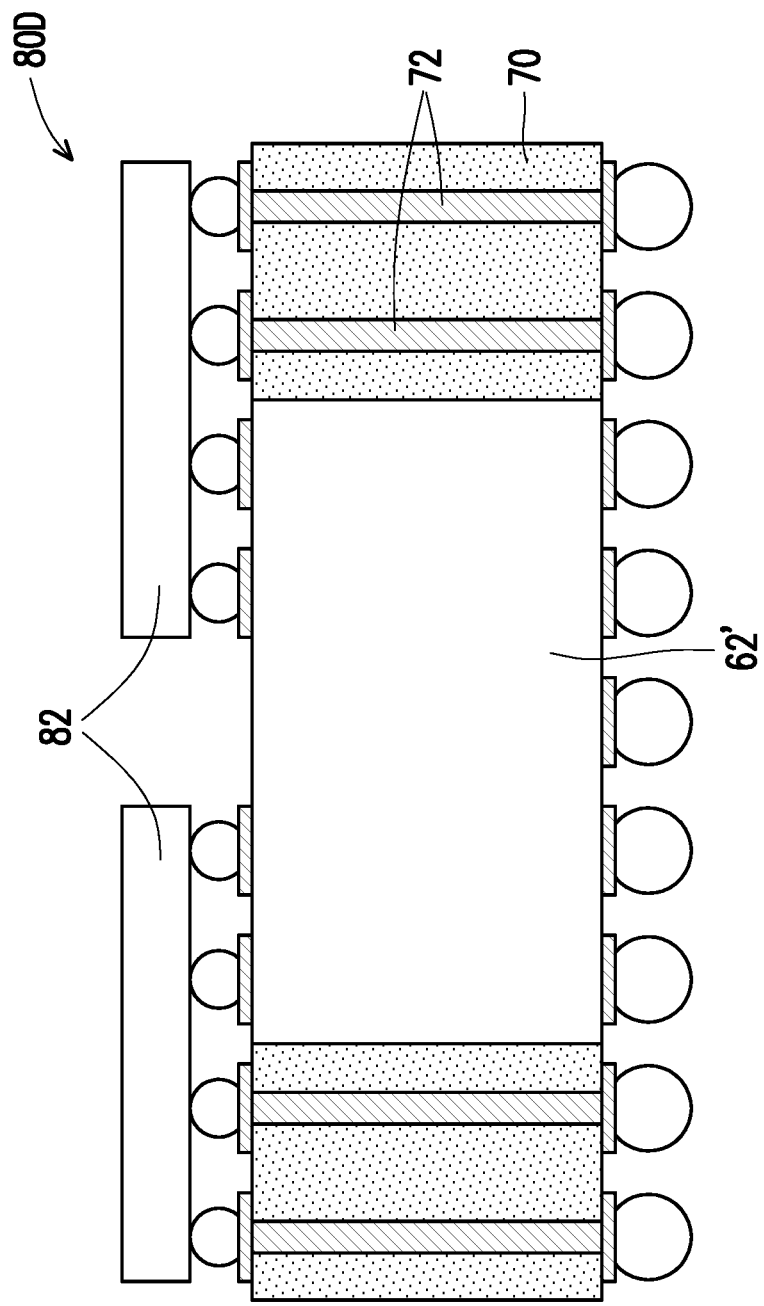
Figure 31:
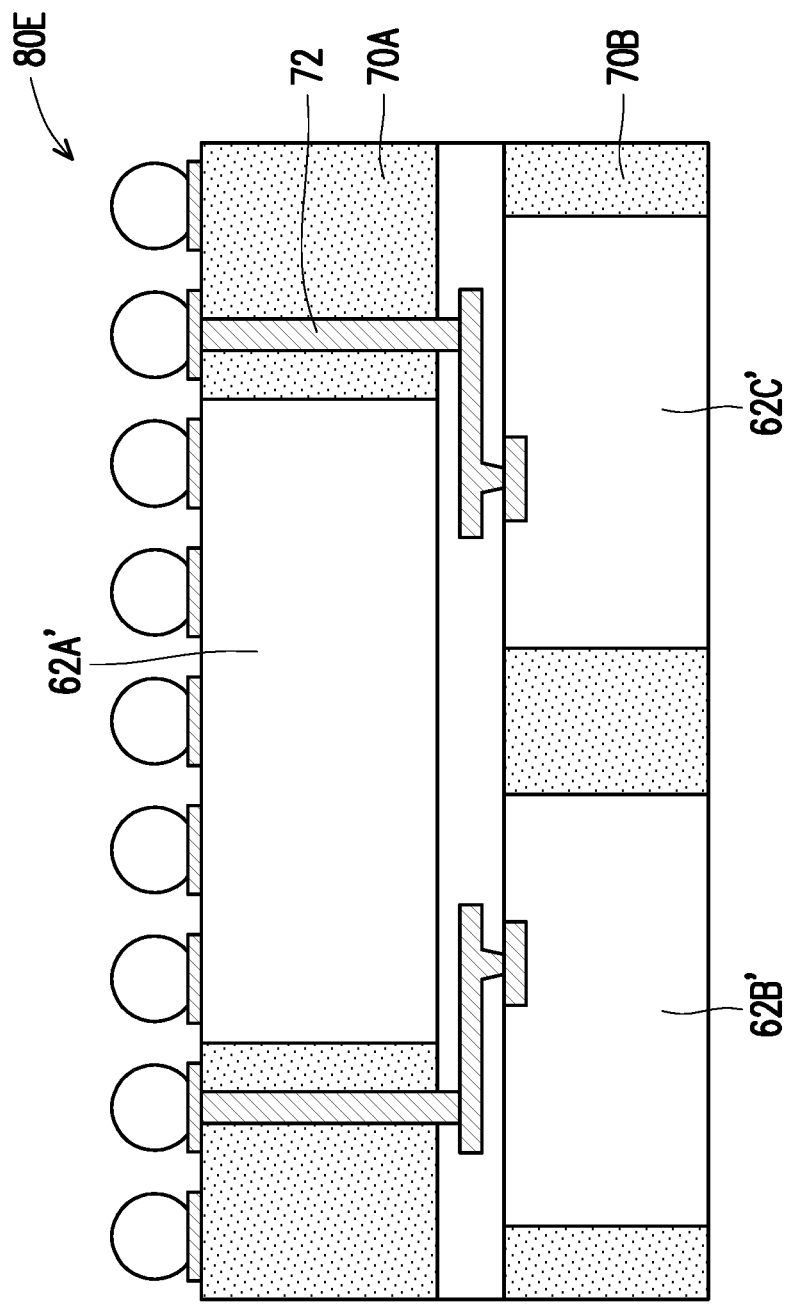

FIGS. 27 through 31 illustrate the example applications of Integrated Fan-Out (InFO) packages 80A, 80B, 80C, 80D, and 80E. The packages include 62', which may be package 562', package 462', or package 362' (FIG. 22 or 26) in accordance with some embodiments. As shown in FIG. 27, package 80A is formed. Package 80A includes package 62' encapsulated in encapsulant 70, which may be, or may comprise, a molding compound, a molding underfill, a resin, an epoxy, or the like. Through-vias 72 are formed in encapsulant 70 to interconnect the conductive features on the opposite sides of encapsulant 70. FIG. 28 illustrates InFO package 80B, which is similar to the package 80A shown in FIG. 27, except no through-vias are formed in encapsulant 70, and no electrical connectors are formed underlying encapsulant 70. FIG. 29 illustrates InFO package 80C, which is similar to the package 80B shown in FIG. 28, except device die 82 is bonded to package 62' through flip-chip bonding. FIG. 30 illustrates InFO package 80D, which is similar to the package 80A shown in FIG. 27, except two device dies 82 are bonded to package 62' and through-vias 72 through flip chip bonding. FIG. 31 illustrates package 80E including two tiers of packages 62' (including 62A', 62B', and 62C'), which are encapsulated in encapsulant 70A and 70B.

Figure 32:
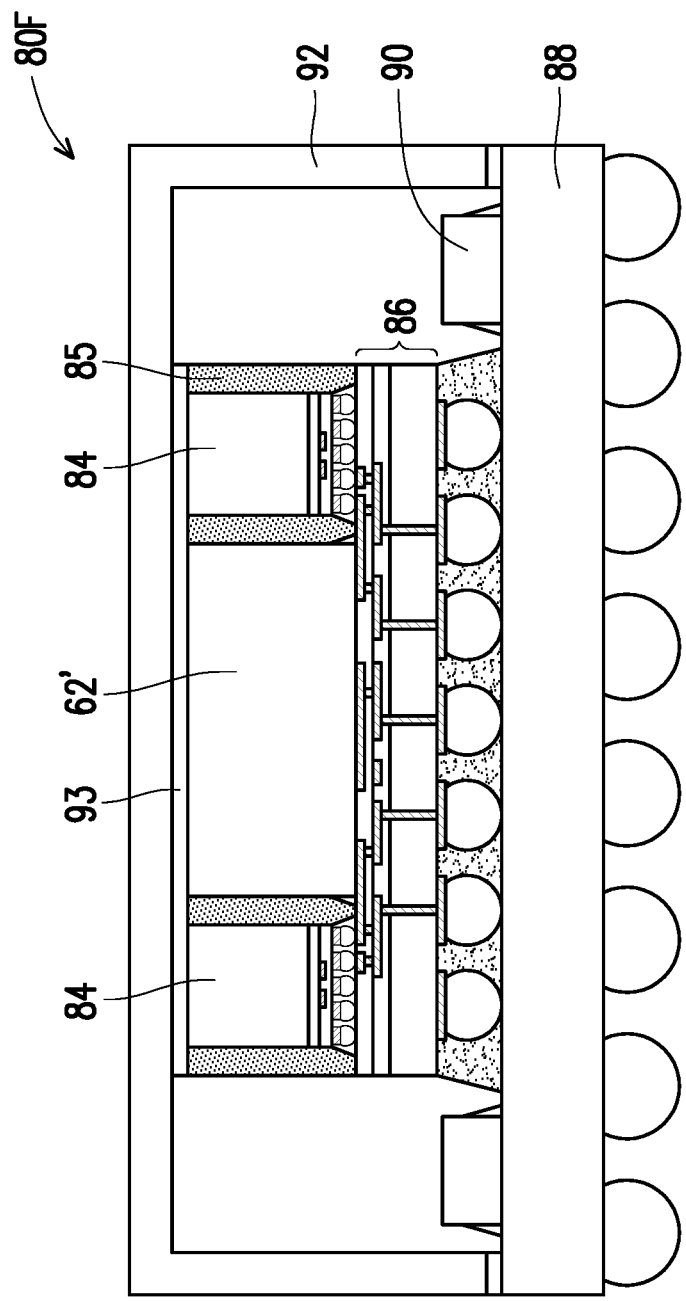
Figure 33:
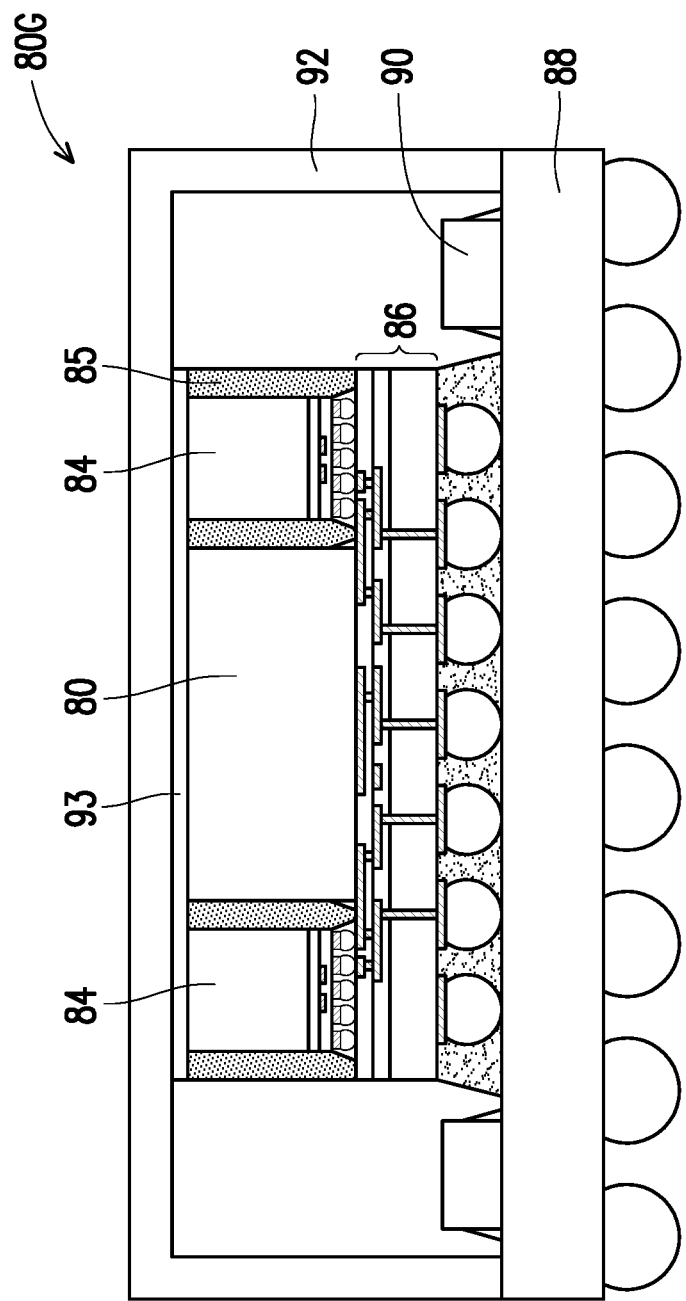

FIGS. 32 and 33 illustrate the example applications of Chip-on-Wafer-on-Substrate (CoWoS) packages 80F and 80G, respectively, which further include packages 62'. Packages 62' may be package 562', package 462', or package 362' (FIG. 22 or 26) in accordance with some embodiments, as discussed in preceding embodiments. As shown in FIG. 32, package 80F includes package 62' and memory stacks 84 encapsulated in encapsulant 85, which may be or may comprise a molding compound, a molding underfill, a resin, an epoxy, or the like. Interposer 86 is underlying and bonded to package 62' and memory stacks 84. Package substrate 88 is further underlying and bonded to interposer 86. Surface-Mount Devices (SMDs) 90, which may be or include passive devices such as capacitors, inductors, or the like, are bonded to package substrate 88. Metal cap 92 is placed on package substrate 88, with Thermal Interface Material (TIM) 93 joining metal cap 92 to package 62' and memory stacks 84. FIG. 33 illustrates a package 80G similar to the embodiment shown in FIG. 32, except that the package 62' show in FIG. 32 is replaced with package 80, which may be any of the InFO packages 80A, 80B, 80C, 80D, and 80E as shown in FIGS. 27 through 31.

As shown in FIGS. 22 and 26 and the corresponding formation processes, device die 110' may be in the center of the package. In accordance with some embodiments of the present disclosure, device dies 210', 310', 410' and 510' may be bonded starting from the center device die 110', and the subsequently bonded devices may be bonded from alternating sides of device die 110'. For example, device die 210' may be bonded to the front side of device die 110', device die 310' may then be bonded to the backside of device die 110', device die 410' may then be bonded to the front side of device die 110' again, and device die 510' may be bonded to the backside of device die 110' again. The center die 110' may be a computing die, and other application dies are bonded on the opposite side of center die 110'. Also, the outer dies of the packages may be increasingly larger than the corresponding inner dies. Such a scheme of allocation has some advantageous features. For example, the computing die, being in the center, has short distances from all other dies, and the performance of the package may be improved without significant bottleneck in the accessing speed. Also, through the alternating bonding scheme, it is possible to form through-vias 152 directly interconnecting device dies 210' and 310', and through-vias 352 directly interconnecting device dies 310' and 410'. Through-vias 552 may also be used to interconnect device dies 410' and 510' through bond pads 542 (FIG. 26) and the underlying RDLs in device dies 510'. The direct connection between the dies significantly improves the speed of the resulting package. Also, through the alternating bonding scheme, each of the wafers may be used as a carrier so that no additional carrier is needed.

The embodiments of the present disclosure have some advantageous features. By stacking dies, the footprint of the package is reduced. By making the inner dies smaller than the outer dies, direct connections may be formed between each pair of dies. Since each of the dies is thinned, the thickness of the package is small. Due to the direct connection and the small distance between the dies, the signal transmission performance is improved.

In accordance with some embodiments of the present disclosure, a package includes a first device die; a second device die bonded to the first device die, wherein the second device die is larger than the first device die, and wherein first bond pads of the first device die are bonded to second bond pads of the second device die through metal-to-metal bonding, and a first surface dielectric layer of the first device die is bonded to a second surface dielectric layer of the second device die through fusion bonding; a first isolation region encapsulating the first device die therein, wherein the first device die, the second device die, and the first isolation region form parts of a first package; a third device die bonded to the first package, wherein the third device die is larger than the first package, and wherein third bond pads of the third device die are bonded to fourth bond pads of the first package through metal-to-metal bonding, and a third surface dielectric layer of the third device die is bonded to a fourth surface dielectric layer of the first package through fusion bonding; and a second isolation region encapsulating the first package therein, wherein the first package, the third device die, and the second isolation region form parts of a second package. In an embodiment, the package further comprises a first through-via penetrating through the first isolation region, wherein the first through-via direct connects the second device die to the third device die. In an embodiment, the second device die and the third device die are on a front side and a backside, respectively, of the first device die. In an embodiment, the package further comprises a fourth device die bonded to the second package, wherein the fourth device die is larger than the second package, and wherein fifth bond pads of the fourth device die are bonded to sixth bond pads of the second package through metal-to-metal bonding, and a fifth surface dielectric layer of the fourth device die is bonded to a sixth surface dielectric layer of the second package through fusion bonding; and a third isolation region encapsulating the second package therein, wherein the second package, the fourth device die, and the third isolation region form parts of a third package. In an embodiment, the package further comprises a fifth device die bonded to the third package, wherein the fifth device die is larger than the third package, and wherein seventh bond pads of the fifth device die are bonded to eighth bond pads of the third package through metal-to-metal bonding, and a seventh surface dielectric layer of the fifth device die is bonded to an eighth surface dielectric layer of the third package through fusion bonding; and a fourth isolation region encapsulating the third package therein, wherein the third package, the fifth device die, and the fourth isolation region form parts of a fourth package. In an embodiment, the package further comprises an encapsulant encapsulating the fourth package therein; and redistribution lines formed over the encapsulant and the fourth package, wherein the redistribution lines extend laterally beyond opposite edges of the fourth package. In an embodiment, the package further comprises a second through-via penetrating through the second isolation region, wherein the second through-via interconnects the third device die and the fourth device die electrically. In an embodiment, the first isolation region comprises a silicon nitride liner contacting both of the first device die and the second device die; and an oxide region on the silicon nitride liner. In an embodiment, the fourth surface dielectric layer of the first package have opposite edges flush with corresponding opposite edges of a semiconductor substrate of the second device die.

In accordance with some embodiments of the present disclosure, a package includes a first device die; a second device die bonded to a front side of the first device die; a first gap-filling material encircling the first device die to form a first package along with the first device die and the second device die, wherein edges of the first gap-filling material are flush with respective edges of the second device die; a third device die bonded to the first package, wherein the third device die is on a backside of the first device die; and a second gap-filling material encircling the first package to form a second package along with the first package and the third device die, wherein edges of the second gap-filling material are flush with respective edges of the third device die. In an embodiment, the first device die is bonded to the second device die through a first hybrid bonding comprising metal-to-metal direct bonding and fusion bonding, and the third device die is bonded to the first package through a second hybrid bonding. In an embodiment, the package further comprises a first through-via penetrating through the first gap-filling material; and a second through-via penetrating through the second gap-filling material. In an embodiment, the package further comprises a fourth device die bonded to the second package, wherein the fourth device die is on a backside of the second device die; and a third gap-filling material encircling the second package to form a third package along with the second package and the fourth device die, wherein edges of the third gap-filling material are flush with respective edges of the fourth device die. In an embodiment, the package further comprises a first through-via penetrating through the first gap-filling material; a second through-via penetrating through the second gap-filling material; and a third through-via penetrating through the third gap-filling material. In an embodiment, the first through-via directly connects the second device die to the third device die, and the second through-via directly connects the third device die to the fourth device die.

In accordance with some embodiments of the present disclosure, method includes bonding a first device die onto a second device die of a first wafer; encapsulating the first device die in a first gap-filling material; forming first bond pads on a backside of a first semiconductor substrate of the second device die, wherein the first bond pads are electrically connected to first through-vias penetrating through the first semiconductor substrate; singulating the first wafer and the first gap-filling material to form a first package, wherein the first package comprises the first device die and the second device die; bonding the first package onto a third device die of a second wafer; encapsulating the first package in a second gap-filling material; forming second bond pads on a backside of a second semiconductor substrate of the third device die, wherein the second bond pads are electrically connected to second through-vias penetrating through the second semiconductor substrate; and singulating the second wafer and the second gap-filling material to form a second package, wherein the second package comprises the first package and the third device die. In an embodiment, the first device die is bonded to the second device die through hybrid bonding. In an embodiment, the method further comprises forming a first through-via penetrating through the first gap-filling material, wherein the first through-via directly connects the first device die to the second device die. In an embodiment, the method further comprises bonding the second package onto a fourth device die of a third wafer; encapsulating the second package in a third gap-filling material; forming third bond pads on a backside of a third semiconductor substrate of the fourth device die, wherein the third bond pads are electrically connected to third through-vias penetrating through the third semiconductor substrate; and singulating the third wafer and the third gap-filling material to form a third package, wherein the third package comprises the second package and the fourth device die. In an embodiment, the forming the first bond pads comprises planarizing the backside of the first semiconductor substrate of the second device die to reveal TSVs; etching the first semiconductor substrate to allow portions of the TSVs to protrude beyond the first semiconductor substrate; forming a dielectric layer to encapsulating the portions of the TSVs; and forming the first bond pads to electrically connect to the TSVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first device die;
    a second device die bonded to the first device die, wherein the second device die is larger than the first device die, and wherein first bond pads of the first device die are bonded to, and are in physical contact with, second bond pads of the second device die through metal-to-metal bonding, and a first surface dielectric layer of the first device die is bonded to, and is in physical contact with, a second surface dielectric layer of the second device die through fusion bonding;
    a first isolation region encapsulating the first device die therein, wherein the first device die, the second device die, and the first isolation region form parts of a first package;
    a third device die bonded to the first package, wherein the third device die is larger than the first package, and wherein third bond pads of the third device die are bonded to, and are in physical contact with, fourth bond pads of the first package through metal-to-metal bonding, and a third surface dielectric layer of the third device die is bonded to, and is in physical contact with, a fourth surface dielectric layer of the first package through fusion bonding; and a second isolation region encapsulating the first package therein, wherein the first package, the third device die, and the second isolation region form parts of a second package.

2. The package of claim 1 further comprising a first through-via penetrating through the first isolation region, wherein the first through-via direct connects the second device die to the third device die.

3. The package of claim 1, wherein the second device die and the third device die are on a front side and a backside, respectively, of the first device die.

4. The package of claim 1 further comprising:

a fourth device die bonded to the second package, wherein the fourth device die is larger than the second package, and wherein fifth bond pads of the fourth device die are bonded to sixth bond pads of the second package through metal-to-metal bonding, and a fifth surface dielectric layer of the fourth device die is bonded to a sixth surface dielectric layer of the second package through fusion bonding; and a third isolation region encapsulating the second package therein, wherein the second package, the fourth device die, and the third isolation region form parts of a third package.

5. The package of claim 4 further comprising:

a fifth device die bonded to the third package, wherein the fifth device die is larger than the third package, and wherein seventh bond pads of the fifth device die are bonded to eighth bond pads of the third package through metal-to-metal bonding, and a seventh surface dielectric layer of the fifth device die is bonded to an eighth surface dielectric layer of the third package through fusion bonding; and a fourth isolation region encapsulating the third package therein, wherein the third package, the fifth device die, and the fourth isolation region form parts of a fourth package.

6. The package of claim 5 further comprising:

an encapsulant encapsulating the fourth package therein; and redistribution lines formed over the encapsulant and the fourth package, wherein the redistribution lines extend laterally beyond opposite edges of the fourth package.

7. The package of claim 4 further comprising a second through-via penetrating through the second isolation region, wherein the second through-via interconnects the third device die and the fourth device die electrically.

8. The package of claim 1, wherein the first isolation region comprises:

a silicon nitride liner contacting both of the first device die and the second device die; and an oxide region on the silicon nitride liner.

9. The package of claim 1, wherein the fourth surface dielectric layer of the first package have opposite edges flush with corresponding opposite edges of a semiconductor substrate of the second device die.

10. A package comprising:

a first device die;

a second device die bonded to a front side of the first device die, wherein the first device die and the second device die contact each other to form a first interface;

a first gap-filling material encircling the first device die to form a first package along with the first device die and the second device die;

a third device die bonded to the first package, wherein the third device die is on a backside of the first device die; and a second gap-filling material encircling the first package to form a second package along with the first package and the third device die, wherein a first edge of the first gap-filling material contacts a second edge of the second gap-filling material to form a second interface perpendicular to the first interface, and the second interface is flush with a respective edge of the second device die.

11. The package of claim 10, wherein a first dielectric layer in the first device die is physically joined to a second dielectric layer in the second device die, and a first bond pad in the first device die is physically joined to a second bond pad in the second device die.

12. The package of claim 10 further comprising:

a first through-via penetrating through the first gap-filling material; and a second through-via penetrating through the second gap-filling material.

13. The package of claim 10 further comprising:

a fourth device die bonded to the second package, wherein the fourth device die is on a backside of the second device die; and a third gap-filling material encircling the second package to form a third package along with the second package and the fourth device die, wherein a third edge of the second gap-filling material contacts a fourth edge of third gap-filling material to form a third interface perpendicular to the first interface, and the second interface is vertically aligned to a respective edge of the third device die.

14. The package of claim 13 further comprising:

a first through-via penetrating through the first gap-filling material;

a second through-via penetrating through the second gap-filling material; and a third through-via penetrating through the third gap-filling material.

15. The package of claim 14, wherein the first through-via directly connects the second device die to the third device die, and the second through-via directly connects the third device die to the fourth device die.

16. A package comprising:

a first device die comprising:

a semiconductor substrate; and a through-substrate via penetrating through the semiconductor substrate;

a second device die overlying and bonded to the first device die, wherein a first dielectric layer in the first device die is physically joined to a second dielectric layer in the second device die, and a first bond pad in the first device die is physically joined to a second bond pad in the second device die;

a third device die underlying and bonded to the first device die;

a first gap-filling material encircling the first device die, wherein the first gap-filling material is overlapped by the second device die and overlapping the third device die; and a first through-dielectric via penetrating through the first gap-filling material, wherein the first through-dielectric via electrically interconnects the second device die and the third device die.

17. The package of claim 16 further comprising a second gap-filling material encircling the first device die and the first gap-filling material, wherein the first gap-filling material and the second gap-filling material form a vertical interface.

18. The package of claim 17, wherein edges of the first gap-filling material are flush with respective edges of the second device die, and wherein edges of the second gap-filling material are flush with respective edges of the third device die.

19. The package of claim 17 further comprising a second through-dielectric via penetrating through the second gap-filling material, wherein a top end of the second through-dielectric via is higher than a top surface of the second device die, and a bottom end of the second through-dielectric via is in physical contact with the third device die.

20. The package of claim 16 further comprising a redistribution structure between, and bonding to, the first device die and the third device die, wherein the redistribution structure comprises a plurality of dielectric layers and conductive features in the plurality of dielectric layers, and wherein edges of the dielectric layers are flush with corresponding edges of the second device die, and are laterally recessed from corresponding edges of the third device die.

* * * * *